(12) United States Patent
Lee et al.

(10) Patent No.: US 11,513,167 B2
(45) Date of Patent: Nov. 29, 2022

(54) ELECTRONIC DEVICE AND METHOD FOR DETECTING CONNECTION STATE OF CONNECTION INTERFACE

(71) Applicant: Samsung Electronics Co., Ltd., Gyeonggi-do (KR)

(72) Inventors: Cheolho Lee, Gyeonggi-do (KR); Seungjoon Yoon, Gyeonggi-do (KR)

(73) Assignee: Samsung Electronics CO., LTD., Suwon-si (KR)

( * ) Notice: Subject to any disclaimer, the term of this patent is extended or adjusted under 35 U.S.C. 154(b) by 174 days.

(21) Appl. No.: 17/012,381

(22) Filed: Sep. 4, 2020

(65) Prior Publication Data
US 2021/0072326 A1 Mar. 11, 2021

(30) Foreign Application Priority Data
Sep. 6, 2019 (KR) .................. 10-2019-0110892

(51) Int. Cl.
| | |
|---|---|
| *G01R 31/70* | (2020.01) |
| *G01R 31/28* | (2006.01) |
| *H05K 1/02* | (2006.01) |
| *H05K 1/11* | (2006.01) |

(52) U.S. Cl.
CPC ......... *G01R 31/70* (2020.01); *G01R 31/2801* (2013.01); *H05K 1/0268* (2013.01); *H05K 1/11* (2013.01)

(58) Field of Classification Search
None
See application file for complete search history.

(56) References Cited

U.S. PATENT DOCUMENTS

| | | |
|---|---|---|
| 8,891,122 B2 | 11/2014 | Inokuchi |
| 2004/0268193 A1 | 12/2004 | Nishida et al. |
| 2014/0068332 A1 | 3/2014 | Choi et al. |
| 2017/0299644 A1 | 10/2017 | Kaltenegger et al. |
| 2018/0138412 A1 | 5/2018 | Han |

FOREIGN PATENT DOCUMENTS

| | | |
|---|---|---|
| CN | 106124916 A | 11/2016 |
| CN | 208172494 U | 11/2018 |
| KR | 10-2004-0078259 A | 9/2004 |
| KR | 10-0670601 B1 | 1/2007 |
| KR | 10-2010-0082522 A | 7/2010 |

OTHER PUBLICATIONS

English translation of KR200400785259A (Year: 2004).*
English translation of KR20100082522A (Year: 2010).*
International Search Report dated Dec. 22, 2020.

* cited by examiner

*Primary Examiner* — Jermele M Hollington
(74) *Attorney, Agent, or Firm* — Cha & Reiter, LLC

(57) ABSTRACT

An electronic device according to certain embodiments comprises a printed circuit board (PCB); a processor mounted on the PCB; and a connection interface configured to connect the PCB to an off-board electronic component, wherein the processor is configured to: output an inspection signal to the connection interface according to a particular bit pattern at a designated bit rate; identify a voltage level of a reception signal input to the processor, during a designated time, in response to the output of the inspection signal particular bit pattern; and determine a connection state of the connection interface based on the identified voltage level of the reception signal.

10 Claims, 14 Drawing Sheets

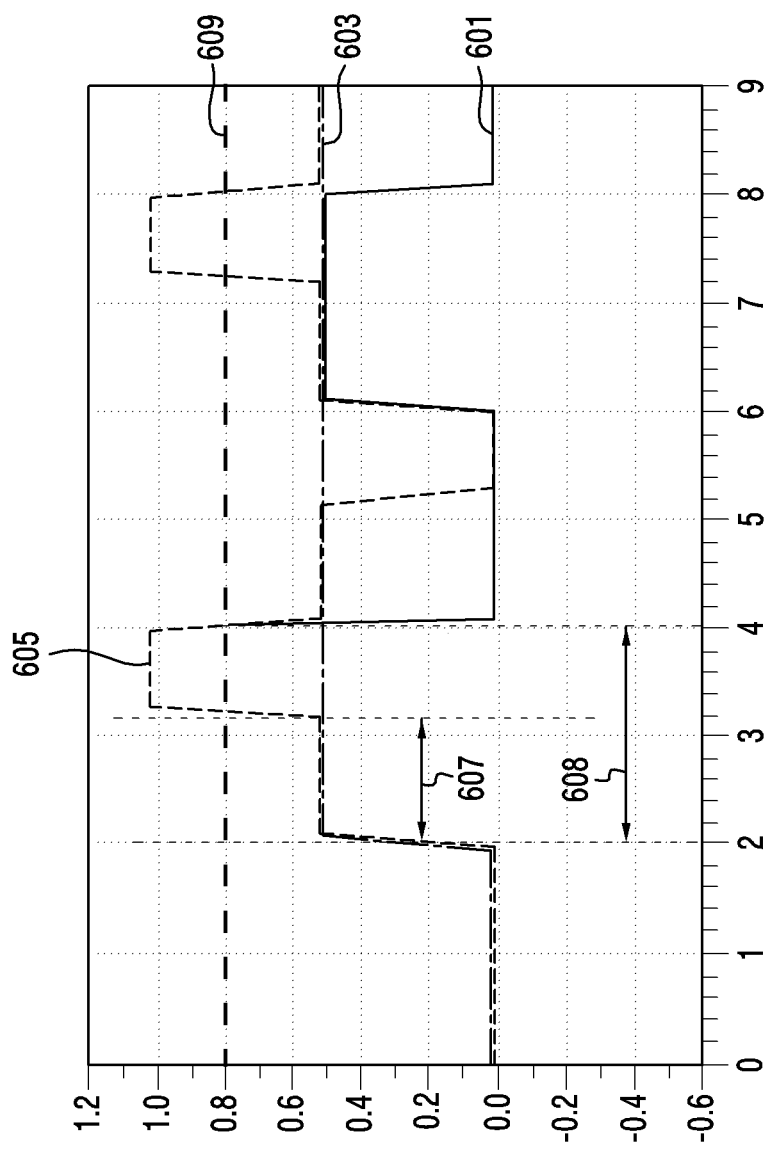

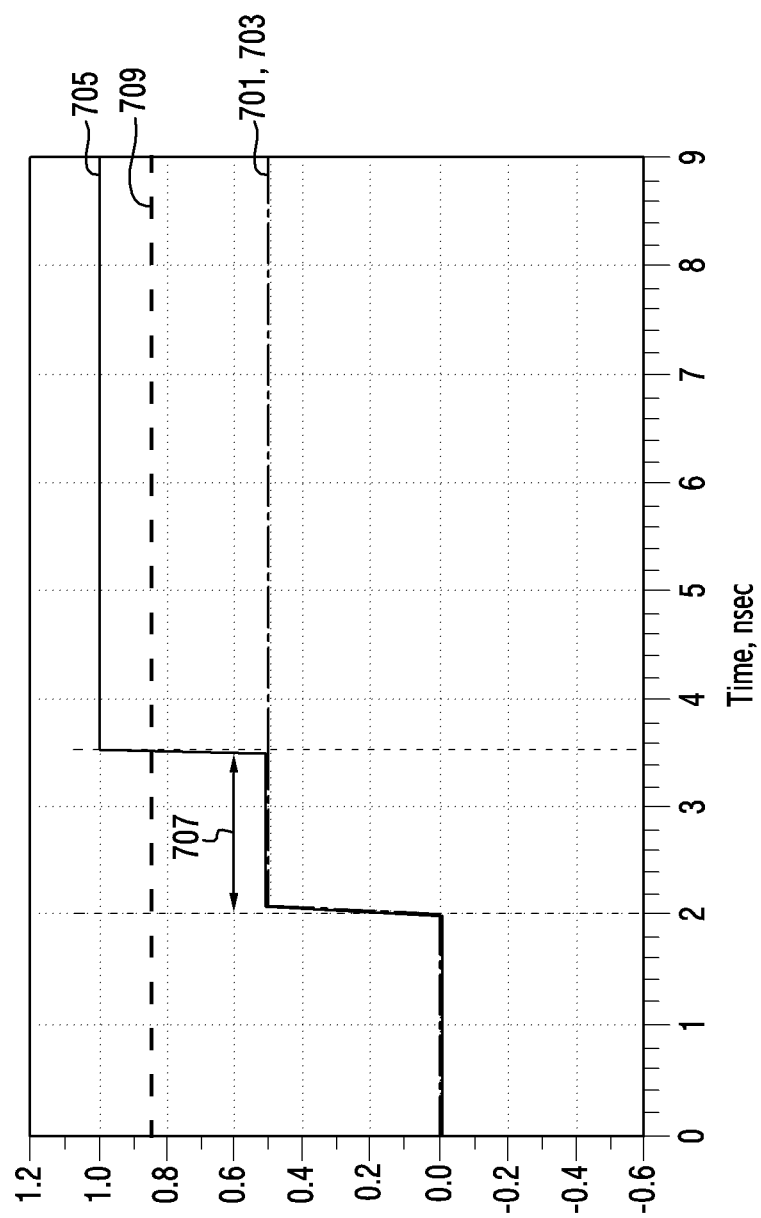

ELECTRONIC DEVICE AND METHOD FOR DETECTING CONNECTION STATE OF CONNECTION INTERFACE

CROSS-REFERENCE TO RELATED APPLICATION(S)

This application is based on and claims priority under 35 U.S.C. 119 to Korean Patent Application No. 10-2019-0110892, filed on Sep. 6, 2019, in the Korean Intellectual Property Office, the disclosure of which is herein incorporated by reference in its entirety.

BACKGROUND

1) Field

Certain embodiments relate to an electronic device and, more specifically, to an electronic device for detecting a connection state of a connection interface included in an electronic device, and a method therefor.

2) Description of Related Art

Recently, in order to provide various functions, electronic devices such as mobile communication terminals or smartphones may have various components mounted on a main board (e.g., a printed board assembly (PBA) or a printed circuit board (PCB)), and independent components or modules may be physically connected to the main board using a physical connection interface such as a connector.

The above information is presented as background information only to assist with an understanding of the disclosure. No determination has been made, and no assertion is made, as to whether any of the above might be applicable as prior art with regard to the disclosure.

SUMMARY

An electronic device according to certain embodiments comprises a printed circuit board (PCB); a processor mounted on the PCB; and a connection interface configured to connect the PCB to an off-board electronic component, wherein the processor is configured to: output an inspection signal to the connection interface according to a particular bit pattern at a designated bit rate; identify a voltage level of a reception signal input to the processor, during a designated time, in response to the output of the inspection signal particular bit pattern; and determine a connection state of the connection interface based on the identified voltage level of the reception signal.

According to an embodiment, a method of an electronic device, the electronic device comprising a printed circuit board (PCB), a processor mounted on the PCB and a connection interface, comprises: outputting an inspection signal having a particular bit pattern based on a designated frequency to the connection interface, by the processor; identifying a voltage level of a reception signal input to the processor, during a designated time, in response to the output of the inspection signal particular bit pattern; and determining a connection state of the connection interface based on the identified voltage level of the reception signal.

The technical subjects pursued in the disclosure are limited to the above-mentioned technical subjects, and other technical subjects which are not mentioned may be clearly understood, through the following description by those skilled in the art of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6A illustrates an example of a reception voltage for describing an example of an operation of inspecting a connection interface of an electronic device according to certain embodiments.

FIG. 7A illustrates another example of a reception voltage for describing another example of an operation of inspecting a connection interface of an electronic device according to certain embodiments.

DETAILED DESCRIPTION

An electronic device can suffer malfunction or failure for a variety of reasons. One reason can a failure of a line in a connection interface. A connection interface connects printed circuit boards to other electronic components that are not mounted on the printed circuit board. Certain aspects of the invention provide a method for inspecting a failure of the connection interface without adding hardware.

According to certain embodiments, an electronic device may efficiently identify whether a signal line of a connection interface, which connects a main board having a processor mounted thereon to a module to be inspected (or an independent module), is normal.

According to certain embodiments, a state such as an open or short state which may occur in each of signal lines of a connection interface, connected to a main board, may be simply identified without additional separate hardware.

According to certain embodiments, especially, a mobile electronic device may have a reduced product size, provide a module to be inspected (or independent module) for providing various functions, and lower the rate of occurrence of a failure that may occur due to connection to a main board, thereby lowering manufacturing costs and facilitating post-inspection for defects.

A processor mounted on the main board can determine whether one of the lines in the connection interface has failed by transmitting an inspection signal over the connection interface. The processor can then determine the state of the connection interface based on a reception signal (or absence) from the connection interface.

Figure 1:
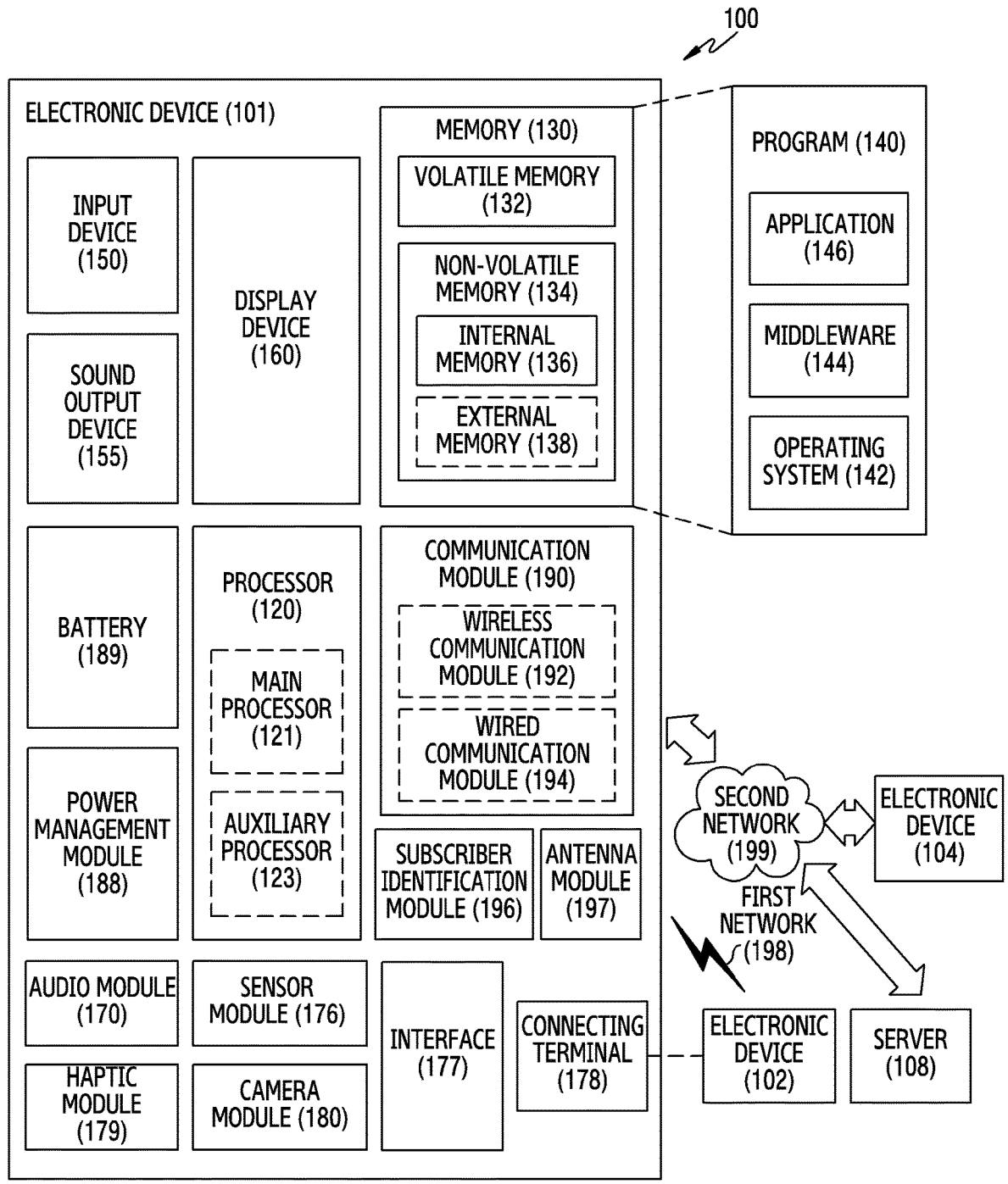
FIG. 1 illustrates an example of a network environment including an electronic device according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The foregoing are implemented by electronic components. For example, the electronic device 101 may include a printed circuit board (PCB) with a processor mounted, thereon. While a PCB can interconnect a variety of electronic components that are mounted on the PCB, other electronic components may not be mounted onto the PCB. The electronic components mounted on the PCB interconnect with the electronic components that are not mounted on the PCB with a connection interface.

Figure 2:
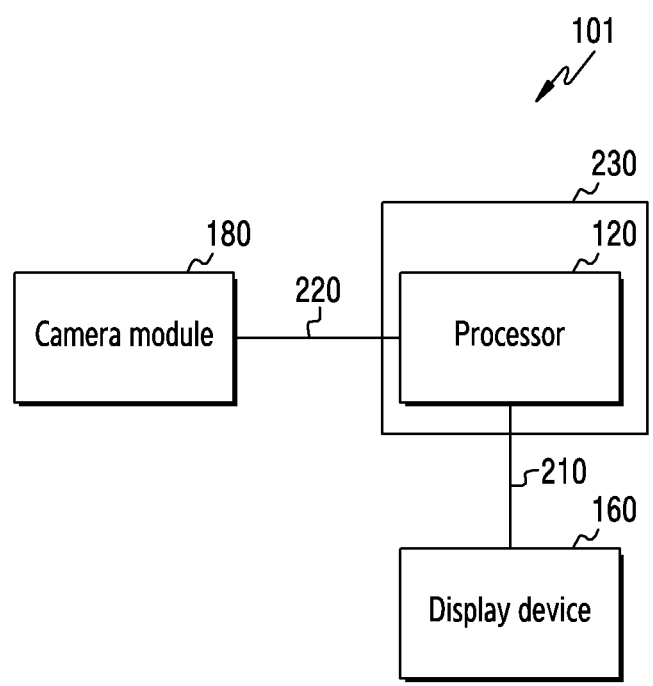
FIG. 2 is an example of the functional configuration of an electronic device according to certain embodiments.

For example, in FIG. 2, there is a processor 120 that is mounted on a PCB 230. Electronic components such as the camera module 180 and the display device 160 are not mounted on the PCB 230. The term "off-board" shall refer to not mounted on the PCB, but may be connected to the PCB by other means, such as a cable. For example, an "off-board electronic component" refers to an electronic component that is not mounted on the PCB, but may be connected to the PCB by other means.

The PCB 230 is connected the camera module 180 by connection interface 220 and the display device 160 by connection interfaces 210 and 220. The configuration may be included in the electronic device 101 illustrated in FIG. 1. It is noted that the camera module 180 and the display device 160 are only examples of electronic components. Electronic components can include a variety of other examples, and can even include another PCB. Each of the connection interfaces 210 and 220 may include, for example, a board-to-board (B2B) connector or a connector between modules for physically connecting the PCB 230 (e.g., a main PBA or a main PCB) to the display device 160 or the camera module 180. The PCB 230, the display device 160, and the camera module 180, for example, may be detachably connected through the connection interfaces 210 and 220, to the PCB 230.

The processor 120 may transmit or receive data to or from the display device 160 and/or the camera module 180 through the connection interface 210 and/or 220 using a communication specification defined according to an international standard. To this end, the electronic device 101 may use, for example, the mobile industry processor interface (MIPI) specification. In this case, the processor 120 may transmit or receive data to or from the display device 160 and/or the camera module 180 through the connection interface 210 and/or 220 according to the MIPI specification.

The connection interface 210 and/or 220 may include multiple (e.g., n) signal lines for transmitting a clock, data, and control signal, connected to the processor 120 and the display device 160. The connection interface 210 may include multiple (e.g., n) interconnectable pins at each end of respective signal lines connected to the processor 120 and the display 160.

Whether a connection state of the connection interface 210 and/or 220 is normal may be dependent on whether a connection state of the interconnectable pins is normal. For example, a corresponding signal line may be in an open state, which may occur due to improper connection of a particular pin, or may be in a short state, which may occur due to damage to a particular pin. In addition, whether a connection state of the connection interface 210 and/or 220 is normal may be dependent on whether a connection state of a signal line constituting the connection interface 210 and/or 220 at other locations is normal. For example, a part other than a pin constituting a corresponding signal line may be in an open state or a short state.

The processor 120 may inspect whether a connection state of each individual pin of the multiple engageable pins engaged with the display device 160 and/or the camera module 180 or a connection state of each signal line including a corresponding individual pin is normal.

The processor 120 may transmit or receive a signal to or from the display device 160 by controlling the connection interface 210. The processor 120 may set a bit rate and/or a voltage level of a signal to be transmitted to the display device 160. The processor 120 may identify the bit rate and/or the voltage level of the signal received through the connection interface 210.

The processor 120 may set an inspection signal bit rate in order to inspect a connection state of the connection interface 210. The inspection signal bit rate may be configured differently from the bit rate of a data signal transmitted or received by the processor 120 according to a general operation control of the display device 160.

The processor 120 may transmit or receive a signal to or from the camera module 180 by controlling the connection interface 220. The processor 120 may configure the bit rate and/or the voltage level of a signal to be transmitted to the camera module 180. The processor 120 may identify the bit rate and/or the voltage level of the signal received through the connection interface 220.

The processor 120 may determine an inspection signal bit rate in order to inspect the connection state of the connection interface 220. The inspection signal bit rate may be different from the operating bit rate of a data signal transmitted or received by the processor 120 according to a general operation control of the camera module 180 to prevent the camera module 180 from recognizing the inspection signal as an operating signal.

According to the above description, it is described, as an example, that the connection interfaces 210 and/or 220 correspond to connection interfaces between the processor 120 and modules to be inspected, respectively, that is, a connection interface between the processor 120 and the display device 160 and a connection interface between the processor 120 and the camera module 180. However, in this embodiment, an off-board electronic component to be inspected is not limited to the display device 160 and the camera module 180, and the connection interface between the off-board electronic component to be inspected and the processor 120 is not limited to the connection interface between the display 160 and the processor 120 and the connection interface between the camera module 180 and the processor 120. Further, the embodiment may be applied to all off-board electronic component to be inspected, through a connection interface and requires inspection of the connection state of the corresponding connection interface.

Figure 3:
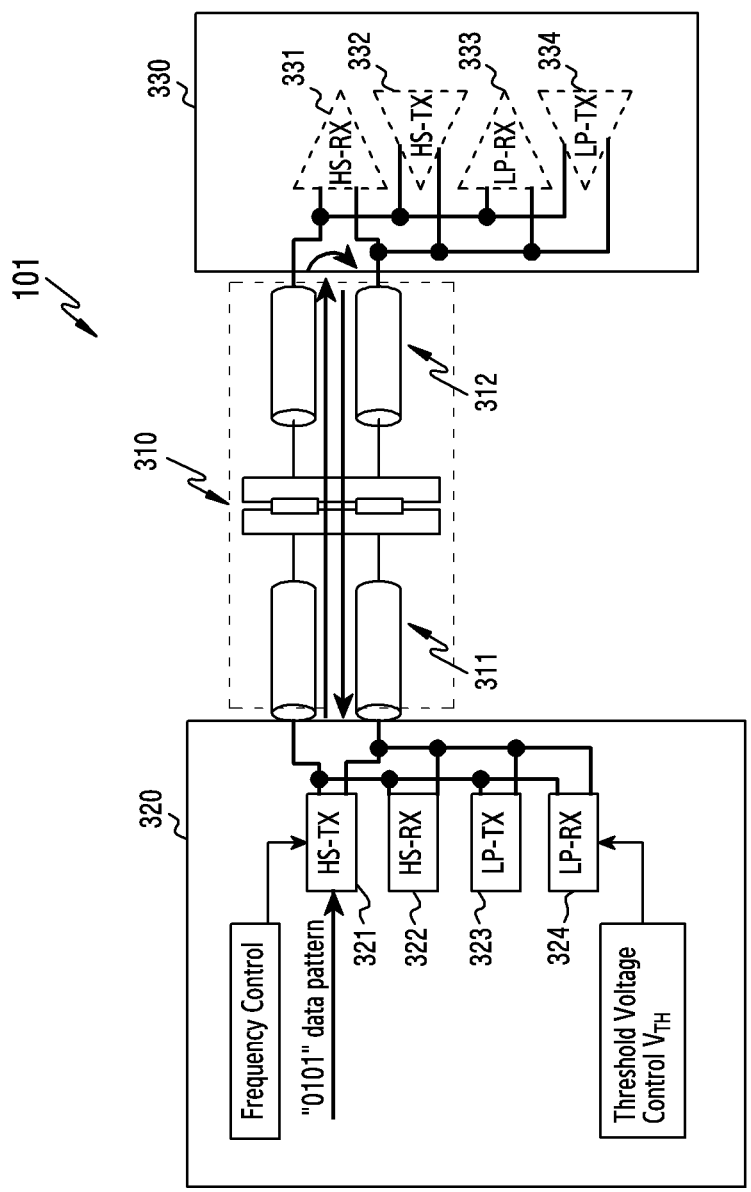
FIG. 3 is another example of the functional configuration of an electronic device according to certain embodiments.

FIG. 3 is another example of the functional configuration of an electronic device according to certain embodiments. The configuration may be included in the electronic device 101 illustrated in FIG. 1 and/or FIG. 2.

Referring to FIG. 3, the electronic device 101 may include a connection interface 310, a processor 320, and an off-board electronic component to be inspected 330. The connection interface 310 may include the connection interface 210 or 220 of FIG. 2. The processor 320 may be connected to the off-board electronic component to be inspected 330 through the connection interface 310. The off-board electronic component to be inspected 330 may include the display device 160 or the camera module 180 of FIG. 2.

The connection interface 310 may include, for example, a connector between off-board electronic components or a board-to-board (B2B) connector such as the connection interface 210 and/or 220 of FIG. 2.

The processor 320 may transmit or receive data to or from the off-board electronic component to be inspected 330 through the connection interface 310. To this end, the electronic device 101 may control the connection interface 310 according to, for example, the MIPI specification.

The connection interface 310 may include multiple (e.g., n) signal lines for transmitting a clock, data, and control signal, connected to each of the processor 120 and the display device 160. The connection interface 310 may include multiple (e.g., n) interconnectable pins at each end of the signal lines connected to the processor 120 and the display device 160, respectively.

Hereinafter, referring to FIG. 3, in the functional configuration for inspecting the connection state of the connection interface 310 according to certain embodiments, one signal line among signal lines each including an individual pin among multiple pins of the connection interface 310 is illustrated. The illustrated one signal line is indicated by the reference numerals "311" and "312" in the drawing, and an interconnectable pin is provided at each end of the signal lines 311 and 312.

Referring to FIG. 3, in order to transmit or receive data to or from the off-board electronic component to be inspected 330 (or the independent module) using the connection interface 310, the processor 320 may include transmission and reception buffers for each of individual signal lines constituting multiple (e.g., n) signal lines of the connection interface 310. The transmission and reception buffers may include, for example, a pair of a high-speed transmission (HS-TX) buffer 321 and a high-speed reception (HS-RX) buffer 322 and a pair of a low-power transmission (LP-TX) buffer 323 and a low-power reception (LP-RX) buffer 324. Each of the transmission and reception buffers 321, 322, 323, and/or 324 may be connected to individual signal lines of the connection interface 310, respectively. The transmission buffers 321 and 323 can avoid latency when the data pattern is temporarily received at a faster rate than connection interface 310 transmits. The reception buffers 322 and 324 can avoid latency when the data is temporarily received from connection interface 310 at a faster rate than can be processed by the processor.

The connection interface 310 may include, for example, a connection interface unit 311 at the processor 320 side and a connection interface unit 312 at the side of the off-board electronic component to be inspected 330. The connection interface unit 311 at the processor 320 side and the connection interface unit 312 at the side of the off-board electronic component to be inspected 330 are engaged with and connected to each other.

In order to transmit or receive data to or from the processor 320 by using the connection interface 310, the off-board electronic component to be inspected 330 may include transmission and reception buffers for each of individual signal lines constituting multiple signal lines of the connection interface 310. The transmission and reception buffers may include, for example, a pair of a high-speed reception (HS-RX) buffer 331 and a high-speed transmission (HS-TX) buffer 332 and a pair of a low-power reception (LP-RX) buffer 333 and a low-power transmission (LP-RX) buffer 334. Each of the transmission and reception buffers 331, 332, 333, and/or 334 may be connected to respective individual signal lines of the connection interface 310.

In the general data transmission or reception operation, the processor 320 may control the transmission and reception buffers 321, 322, 323 and/or 324 and may transmit or receive a signal to or from the off-board electronic component to be inspected 330 through the connection interface 310. Each of the transmission and reception buffers of the processor 320 and the transmission and reception buffers of the off-board electronic component to be inspected 330 may be configured to operate the corresponding transmission and reception buffers during the general transmission or reception operation. For example, a signal transmitted from the high-speed transmission buffer 321 of the processor 320 may be operated to be received by the high-speed reception buffer 331 of the off-board electronic component to be inspected 330. For example, a signal transmitted from the high-speed transmission buffer 332 of the module to be inspected 330 may be operated to be received by the high-speed reception buffer 322 of the processor 320. For example, a signal transmitted from the low-power transmission buffer 323 of the processor 320 may be operated to be received by the low-power reception buffer 333 of the module to be inspected 330. For example, a signal transmitted from the low-power transmission buffer 334 of the off-board electronic component to be inspected 330 may be operated to be received by the low-power reception buffer 324 of the processor 320.

In order to inspect the connection state of the connection interface 310, the processor 320 may control the high-speed transmission buffer 321 and the low-power reception buffer 324 and inspect the connection state of the connection interface 310, which is a path connected to the off-board electronic component to be inspected 330. For example, the processor 320 may transmit an inspection signal for inspecting the connection state of the connection interface 310 from the high-speed transmission buffer 321 of the processor 320. For example, the processor 320 may identify a signal input to the low-power reception buffer 324 of the processor 320 in order to inspect the connection state of the connection interface 310.

The processor 320 may use a bit rate and/or a voltage level of a signal to be transmitted to the off-board electronic component to be inspected 330 (e.g., the display device 160 or the camera module 180). The processor 320 may identify the bit rate and/or the voltage level of the signal received by the connection interface 310 after transmission of the transmission signal.

For example, the inspection signal bit rate output from the processor 320 may be configured differently from the operating bit rate of a data signal transmitted or received by the processor 320 according to a general operation control of the display device 160. For example, the operating bit rate of the inspection signal may be the reciprocal of a value equal to twice the amount of time taken for a signal transmitted from the processor 320 to be transmitted to a final end (e.g., the high-speed reception buffer 331) of the off-board electronic component to be inspected 330. Thus, the inspection signal at the processor 320 will be two cycles ahead of the high-speed reception buffer 331.

For example, the voltage level of the inspection signal output from the processor 320 may be configured to be the same as the voltage level of a general operation signal.

The processor 320 may generate an inspection signal based on the configured bit rate and/or voltage level and may transmit the generated inspection signal from the high-speed transmission buffer 321 to the module to be inspected 330 through the connection interface 310.

The processor 320 may identify the bit rate and/or the voltage level of the signal received through the connection interface 310, and may determine the connection state of the connection interface 310 based on the identification. For example, the processor 320 may identify the bit rate and/or the voltage level of the signal received by the low-power reception buffer 324 and may determine the connection state of the connection interface 210, 220, and/or 310 based on the identification.

According to certain embodiments, an electronic device (e.g., the electronic device 101 of FIG. 1 to FIG. 3) may include: a processor (e.g., the processor 120 of FIG. 1 or FIG. 2 or the processor 320 of FIG. 3); a PCB (e.g., the PCB 230 of FIG. 2) on which the processor is mounted; an off-board electronic component to be inspected (e.g., the display device 160 or the camera module 180 of FIG. 2 and/or FIG. 3), which is connected to the PCB; and a connection interface (e.g., the connection interface 210 or 220 of FIG. 2 or the connection interface 310 of FIG. 3) configured to connect the PCB and the off-board electronic component to be inspected, wherein the processor may: transmit an inspection signal having a designated bit rate and according to a particular bit pattern to the connection interface; identify the voltage level of a reception signal input to the processor, during a designated time, in response to the output of the inspection signal bit pattern; and determine the connection state of the connection interface based on the identified voltage level of the reception signal.

According to certain embodiments, the designated bit rate may be configured based on the reciprocal of a value equal to twice the amount of time taken for the inspection signal transmitted from the processor to reach the module to be inspected.

According to certain embodiments, the processor may determine at least one of an open state and a short state of the connection interface.

According to certain embodiments, the processor may determine the connection state of the connection interface as the open state if the identified voltage level of the reception signal is higher than a first reference voltage level on at least one time point.

According to certain embodiments, the first reference voltage level may be configured to be a level equal to or higher than the voltage level of the inspection signal.

According to certain embodiments, the processor may determine the connection state of the connection interface to be the short state if the identified voltage level of the reception signal is lower than a second reference voltage level on at least one time point.

According to certain embodiments, the second reference voltage level may be configured to be a level lower than or equal to the voltage level of the inspection signal.

According to certain embodiments, the processor may determine an on or off state of the module to be inspected.

According to certain embodiments, as a result of the determination, if the module to be inspected is in the off state, the processor may configure the particular bit patternbit pattern to be a first bit patternbit pattern, wherein the level of at least a part of the first bit pattern may be changed based on the designated bit rate.

According to certain embodiments, as a result of the determination, if the module to be inspected is in the on state, the processor may configure the particular bit pattern to be a second bit pattern, wherein the level of at least a part of the second bit pattern may remain the same.

According to certain embodiments, the processor may include: a high-speed transmission buffer configured to output the inspection signal to the connection interface; and a low-power reception buffer configured to receive the reception signal which is input in response to the output of the inspection signal according to the particular bit pattern.

According certain embodiments, an electronic device (e.g., the electronic device 101 of FIG. 1 to FIG. 3) may include: a processor (e.g., the processor 120 of FIG. 1 or FIG. 2 or the processor 320 of FIG. 3) including a high-speed transmission buffer (e.g., the high-speed transmission buffer 321 of FIG. 3) and a low-power reception buffer (e.g., the low-power reception buffer 324 of FIG. 3); a PCB (e.g., the main board 230 of FIG. 2) on which the processor is mounted; a off-board electronic component to be inspected (e.g., the display device 160 or the camera module 180 of FIG. 2 and/or FIG. 3), which is connected to the PCB; and a connection interface (e.g., the connection interface 210 or 220 of FIG. 2 or the connection interface 310 of FIG. 3) configured to connect the PCB and the off-board electronic component to be inspected, wherein the processor may: transmit an inspection signal having a designated bit rate and according to a particular bit pattern to the connection interface through the high-speed transmission buffer operably connected to the connection interface; identify the voltage level of a reception signal input to the low-power reception buffer operably connected to the connection interface, during a designated time, in response to the output of the inspection signal according to the particular bit pattern; and determine the connection state of the connection interface based on the identified voltage level of the reception signal.

Figure 4:
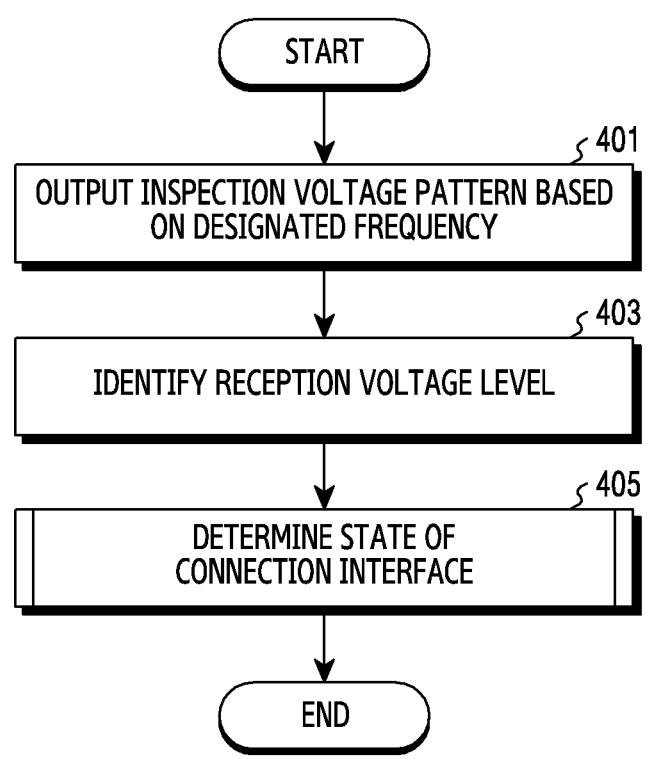
FIG. 4 is an example of an operation of an electronic device according to certain embodiments.

FIG. 4 is an example of the operation of an electronic device according to certain embodiments. The operation may be performed by the electronic device 101 or at least one component (e.g., the processor 120 or 320 or the connection interface 210, 220, and/or 310) included in the electronic device 101, illustrated in FIG. 1, FIG. 2, and FIG. 3.

In FIG. 4, in operation 401, the processor 120 or 320 of the electronic device 101 may output an inspection signal, that is, a transmission signal for an inspection operation, having a designated bit rate and according to an inspection bit pattern.

The processor 120 or 320 may communicate with off-board electronic component (e.g., the display device 160 and/or the camera module 180 of FIG. 1 and FIG. 2 or the module to be inspected 330 of FIG. 3) through the connection interface (e.g., the communication interface 210, 220, and/or 310 of FIG. 2 or FIG. 3) according to a communication specification defined according to an international standard, for example, the mobile industry processor interface (MIPI) specification.

According to certain embodiments, the connection interface 210, 220, and/or 310 may include multiple (e.g., n) signal lines for transmitting a clock, data, and control signal. For example, the connection interface 210, 220, and/or 310 may include a connector for connecting each of the multiple signal lines. The connector may include multiple pins. For example, each of the multiple signal lines of the connection interface 210, 220, and/or 310 may be connected through a combination of a pin at the processor 120 or 320 side and a pin at a display device (e.g., the display 160 of FIG. 1 or FIG. 2) side or a combination of a pin at the processor 120 or 320 side and a pin at camera module (e.g., the camera module 180 of FIG. 1 or FIG. 2) side.

According to certain embodiments, the processor 120 or 320 of the electronic device 101 may detect, for example, an open state of a signal line, which may occur due to improper connection between particular pins for connecting a particular signal line among multiple signal lines, or, for example, a short state of a corresponding signal line, which may occur due to damage to a particular pin, or may detect other open or short states which may occur at other locations of each of signal lines constituting the connection interface 210, 220, and/or 310.

The processor 120 or 320 may generate an inspection signal to be output through the connection interface 210, 220, and/or 310, in order to inspect whether the connection state of each individual pin of multiple engageable pins engaged with the display device 160 and the camera module 180 or the connection state of each signal line including a corresponding individual pin is normal.

To this end, the processor 120 or 320 may configure the operating bit rate (Gbps) of an inspection signal in order to output the inspection signal.

The operating bit rate of the inspection signal may be configured, for example, as in Equation 1 below. For example, the operating bit rate of the inspection signal may be configured to be the reciprocal of a value equal to twice the amount of time taken for a signal transmitted from the processor 120 or 320 to be transmitted to a final end of the module to be inspected 330. For example, the operating bit rate of the inspection signal may be set to be the reciprocal of a value equal to twice the amount of time taken for a signal transmitted from a high-speed transmission buffer 321 of the processor 120 or 320 to be transmitted to an end (e.g., a high-speed reception buffer 331) of the module to be inspected 330.

Operation bit rate (Gbps)=1/(2×a value of the time needed for a signal transmitted from a transmission end to be transmitted to a reception end) [Equation 1]

The processor 120 or 320 may configure a bit pattern having a particular pattern in order to generate the inspection signal to inspect whether the connection state of each individual pin of multiple engageable pins engaged with the module to be inspected 330 (the display device 160 and the camera module 180) or the connection state of each signal line including a corresponding individual pin is normal.

For example, the bit pattern of the inspection signal may be a pattern of repeatedly outputting a voltage of at a proper transmission voltage level (e.g., 0.5 V or 1.0V), signifying a bit 1, and a level of voltage (e.g., 0 V) signifying a bit 0, which are used to transmit a general operation signal of the connection interface 210, 220, and/or 310 according to the specification.

For example, the bit pattern of the inspection signal may be a pattern of constantly and repeatedly outputting a proper transmission voltage level or a proper maximum transmission voltage level (e.g., 0.5 V or 1.0 V) used to transmit a general operation signal of the connection interface 210, 220, and/or 310 according to the specification.

The processor 120 or 320 may output the inspection signal from, for example, a high-speed transmission buffer (e.g., the high-speed transmission buffer 321 of FIG. 3) among transmission buffers connected to multiple signal lines, respectively, in order to inspect the connection state of each of the multiple signal lines of the connection interface 210, 220, and/or 310.

The processor 120 or 320 may generate an inspection signal based on a configured bit rate and/or a voltage level pattern and transmit the generated inspection signal from the high-speed transmission buffer 321 to the module to be inspected 330 through the connection interface 310.

According to certain embodiments, in operation 403, the processor 120 or 320 may monitor the signal received by the processor 120 or 320, during a designated time to identify the level of the reception voltage. The designated time may be, for example, a time equal to or longer than a time twice as long as a time taken for the signal transmitted from the high-speed transmission buffer 321 of the processor 120 or 320 to be transmitted to the end (e.g., the high-speed reception buffer 331) of the module to be inspected 330.

For example, the processor 120 or 320 may identify the bit rate and/or the voltage level of the signal received through the connection interface 310, and may determine the connection state of the connection interface 210, 220, and/or 310 based on the identification.

For example, the processor 120 or 320 may identify the bit rate and/or the voltage level of the signal input to the low-power reception buffer 324 and may determine the connection state of the connection interface 210, 220, and/or 310 based on the identification.

For example, the processor 120 or 320 may continuously monitor the received signal during a designated time to identify the level of the reception voltage.

For example, the processor 120 or 320 may monitor the received signal at a designated time point during a designated time to identify the level of the reception voltage.

According to certain embodiments, in order to inspect the connection state of the connection interface 210, 220, and/or 310, the processor 120 or 320 may control the high-speed transmission buffer 321 and the low-power reception buffer 324 and inspect the connection state of the connection interface 210, 220, and/or 310, which is a path connected to the off-board electronic device to be inspected 330. For example, the processor 120 or 320 may transmit an inspection signal for inspecting the connection state of the connection interface 210, 220, and/or 310 from the high-speed transmission buffer 321 of the processor 120 or 320. For example, the processor 120 or 320 may identify a signal input from the low-power reception buffer 324 of the processor 120 or 320 in order to inspect the connection state of the connection interface 210, 220, and/or 310. The high-speed transmission buffer (e.g., the high-speed transmission buffer 321 of FIG. 3) and/or the high-speed reception buffer (e.g., the high-speed reception buffer 322 of FIG. 3) may be, for example, a differential digital buffer and may distinguish, for example, the value of the "0" level from the value of the "1" level based on a single reference voltage. Alternatively, the low-power reception buffer (e.g., the low-power reception buffer 324 of FIG. 3) may change a reference voltage, or may apply two or more reference voltages, and accordingly may distinguish the value of the voltage level other than "0" and "1". According to certain embodiments, different reference voltages for determining a connection state (e.g., an open, short, or normal state) of each connection interface 210, 220, and/or 310 based on the state (e.g., an on or off state) of the module to be inspected 330 may be configured.

In operation 405, the processor 120 or 320 may identify the voltage level of the reception signal and may determine the connection state of the connection interface 210, 220, and/or 310. In a bit pattern, the voltage level can be the average, median, lowest or highest voltage for bits corresponding to a bit 1 or 0.

To this end, the processor 120 or 320 may configure a reference voltage for determining the connection state of the connection interface 210, 220, and/or 310 based on the level of the received signal. The reference voltage may be configured in advance and stored in, for example, a memory (not shown) in the processor 120 or 320 or a memory (e.g., the memory 130 of FIG. 1).

The reference voltage for determining the connection state of the connection interface 210, 220, and/or 310, for example, a voltage level (a reference voltage or a voltage threshold value) for determining an open state of the connection interface 210, 220, and/or 310, may be configured to be, for example, a value greater than an output voltage value (Vswing) of the processor 120 or 320 for the general transmission or reception operation according to the specification of the connection interface 210, 220, and/or 310 and smaller than the product of the voltage value and 2 (2*Vswing), e.g., Vswing<reference voltage<2*Vswing. Here, "Vswing" may indicate the magnitude of a voltage at the high level (high-state (bit 1)), the voltage being output from the high-speed transmission (HS-TX) buffer while a standard high-speed transmission (HS-TX) buffer and a standard high-speed reception (HS-RX) buffer which are defined by the MIPI specification are connected.

The processor 120 or 320 may compare the voltage level of the received signal and the reference voltage and determine whether the connection interface 210, 220, and/or 310 is in an open state.

For example, the processor 120 or 320 may determine that the connection interface 210, 220 and/or 310 is in the open state if the voltage level of the received signal is equal to or higher than the reference voltage on at least one time point.

The reference voltage for determining the connection state of the connection interface 210, 220, and/or 310, for example, a voltage level (a reference voltage or a voltage threshold value) for determining a short state of the connection interface 210, 220, and/or 310, may be configured differently depending on the state (e.g., an on or off state) of the module to be inspected 330 and/or a bit pattern of the output inspection signal.

The reference voltage for determining the short state may be configured to be, for example, a value equal to or greater than 0 V and smaller than a voltage value (Vswing) for the general data transmission or reception operation according to the specification of the connection interface 210, 220, and/or 310 if the state of the module to be inspected 330 is the on state. For example, if the state of the module to be inspected 330 is the off state, the reference voltage may be configured to be a value smaller than or equal to 0 V and greater than a product (−Vswing) of −1 and a voltage value (Vswing) for the general data transmission or reception operation according to the specification of the connection interface 210, 220, and/or 310.

The processor 120 or 320 may compare the voltage level of the received signal and the reference voltage and determine whether the connection interface 210, 220, and/or 310 is in the short state.

For example, the processor 120 or 320 may determine that the connection interface 210, 220, and/or 310 is in the short state if the voltage level of the received signal is lower than or equal to the reference voltage on at least one time point.

The reference voltage for determining the open state of the connection interface 210, 220, and/or 310 and the reference voltage for determining the short state of the connection interface 210, 220, and/or 310 may be different from each other.

Figure 5:
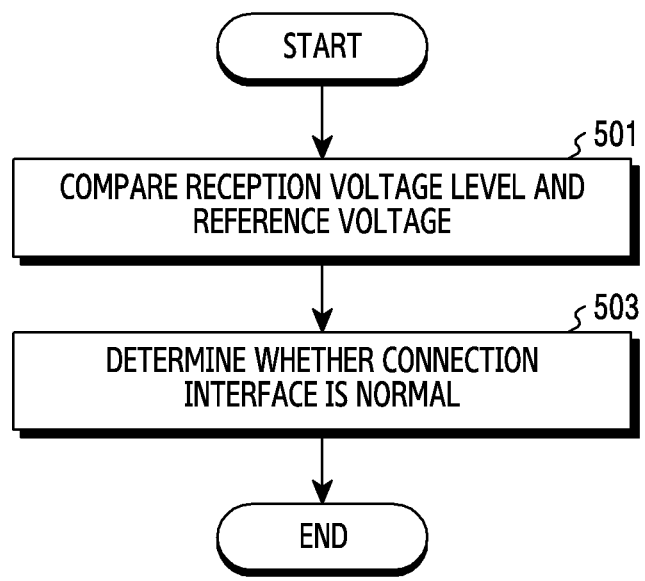
FIG. 5 illustrates an example of the operation of inspecting a connection interface of an electronic device according to certain embodiments.

FIG. 5 illustrates an example of an operation of determining whether a connection interface is normal in an operation of inspecting a connection interface of an electronic device according to certain embodiments. The operations illustrated in FIG. 5 more specifically describe, for example, operation 405 in FIG. 4 of determining the state of the connection interface. The operations may be performed by the electronic device 101 or at least one component (e.g., the processor 120 of FIG. 1, the processor 320 of FIG. 3, and/or the connection interface 210, 220, and/or 310) included in the electronic device 101, illustrated in FIG. 1, FIG. 2, and FIG. 3.

According to certain embodiments, in operation 501, the processor 120 or 320 may monitor a signal received by the processor 120 or 320 and compare the voltage level of the received signal with a reference voltage.

For example, in order to inspect a connection state of the connection interface 210, 220, and/or 310, the processor 120 or 320 may identify a signal received by the low-power reception buffer 324 of the processor 120 or 320.

For example, the processor 120 or 320 may continuously monitor the signal received by the processor 120 or 320, during a designated time, identify a voltage level of the received signal, and compare the voltage level with a reference voltage, that is, a reference voltage level.

For example, the processor 120 or 320 may monitor the signal received by the processor 120 or 320 at a designated time point during a designated time, identify the level of the reception voltage, and compare the same with a reference voltage, that is, a reference voltage level.

The reference voltage for determining a connection state of the connection interface 210, 220, and 310 may include, for example, a first reference voltage for determining an open state and/or a second reference voltage for determining a short state.

A first reference voltage and/or a second reference voltage for determination of an open state and/or a short state of the connection interface 210, 220, and/or 310 may be configured to appropriate values according to the state (e.g., an on/off or active/inactive state) of the module to be inspected (e.g., the module to be inspected 330 of FIG. 3) and/or the bit pattern of the output inspection signal. A first reference voltage for determining the open state of the connection interface 210, 220, and/or 310 may be configured to be, for example, a value greater than Vswing and smaller than 2*Vswing. A second reference voltage for determining the short state of the connection interface 210, 220, and/or 310 may be configured to be, for example, a value smaller than 0 V and greater than −Vswing if the state of the module to be inspected 330 is the off state. In another example, a second reference voltage for determining the short state of the connection interface 210, 220, and/or 310 may be configured to be a value smaller than Vswing and equal to or greater than 0 V if the state of the off-board electronic device to be inspected 330 is the on state.

According to certain embodiments, the processor 120 or 320 may determine the connection state of the connection interface 210, 220, and/or 310 based on a comparison between the voltage level of a reception signal received by the processor 120 or 320 and a reference voltage value.

For example, while continuously monitoring a signal received after the output of an inspection signal based on a designated bit rate, during a designated time, the processor 120 or 320 may determine that a corresponding signal line of the connection interface 210, 220, and/or 310 is in the open state if, for example, a signal having a voltage level higher than the first reference voltage for determination of the open state is received.

For example, while continuously monitoring a signal received after the output of an inspection signal based on a designated bit rate, during a designated time, the processor 120 or 320 may determine that a corresponding signal line of the connection interface 210, 220, and/or 310 is in the short state if, for example, a signal having a voltage level lower than the second reference voltage for determination of the short state is received.

Figure 6B:
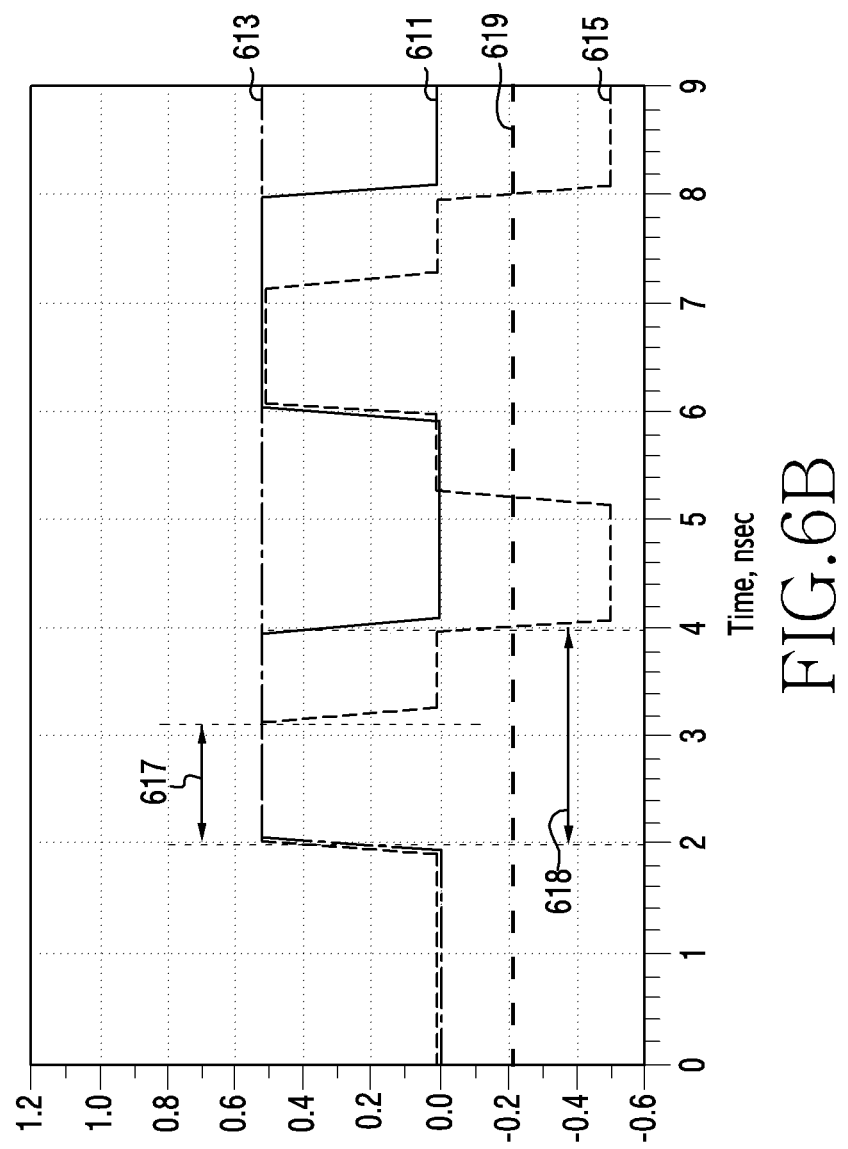
FIG. 6B illustrates an example of a reception voltage for describing an example of an operation of inspecting a connection interface of an electronic device according to certain embodiments.

FIGS. 6A and 6B illustrate an examples of a reception voltage for inspecting the connection interface. The graphs shown in the drawing indicate the voltage level of a signal received by the processor 120 or 320 over time, after an inspection signal is transmitted through a connection interface.

FIGS. 6A and 6B describe an embodiment of the case in which an off-board electronic component to be inspected is in the power-off (inactive) state. For example, no power is supplied to a high-speed reception buffer 331 for the off-board electronic component side.

Referring to FIGS. 6A and 6B, a signal waveform 601 or 611 of an inspection signal output from the processor 120 or 320 over time is illustrated using a solid line. When the connection interface is connected normally, a signal with waveform 603 or 613 is input to the processor 120 or 320 (illustrated using a dashed line). When the connection interface 210, 220, and/or 310 is in the open or short state, a signal with waveform 605 or 615 is input to the processor 120 or 320 is (illustrated using a dashed line).

According to certain embodiments, if the off-board electronic component to be inspected 330 is in the power-off (inactive) state, the processor 120 or 320 may output an inspection signal in a signal waveform 601 or 611 repeatedly changing between the 0 V level and the 0.5 V level such as a bit pattern of "0, 1, 0, 1, . . . " according to a configured period.

When the connection interface 210, 220, and/or 310 is connected normally, a waveform of an inspection signal transmitted from the high-speed transmission buffer 321 of the processor 120 or 320. The inspection signal is reflected after reaching an off-board electronic device to be inspected 330 and is received again by the low-power reception buffer 324. In this case, a time taken while performing the above is (e.g., 4 nsec) is twice as long as a time taken to reach the off-board electronic component to be inspected 330 (a time taken for a signal transmitted from a transmission end to be transmitted to a reception end) (e.g., 2 nsec in FIGS. 6A and 6B).

When an output signal level (601, 611) of the processor 120 or 320 is changed to "0" at a time point (e.g., 4 nsec) at which a reflected wave reaches the processor 120 or 320, the voltage level of a signal waveform 603 or 613 input to the low-power reception buffer 324 may be changed to "1", which is the voltage level of the reflected signal. Accordingly, if a time corresponding to a time twice as long as the time needed for a signal transmitted from a transmission end to be transmitted to a reception end is configured to be the period of the inspection signal (e.g., 4 nsec is configured to be the period in the drawing, hereinafter, referred to as "TC"), and a pattern of the inspection signal is repeated, like "0, 1, 0, 1, . . . " as described above, the reception signal is a constant value equal to the maximum voltage level of the of output signal waveform 601 or 611. That is, the reception signal is staggered by 2 ns, or the period of the inspection signal, thereby resulting in an inverse signal.

As illustrated in FIGS. 6A and 6B, whether the connection interface 210, 220, and/or 310 is connected normally may be inspected by using the time difference between a time corresponding to a time twice as long as the time (TC) taken for a signal waveform output from the processor 120 or 320 to reach the module to be inspected 330 and for a reflected wave to return again to the processor 120 or 320 if the connection interface 210, 220, and/or 310 is connected normally, and a time corresponding to a time twice as long as the time (T) taken for a waveform output from the processor 120 or 320 to reach an abnormal connection point of the connection interface 210, 220, and/or 310 and for a reflected wave to return again to the processor 120 or 320 if the connection interface 210, 220, and/or 310 is connected abnormally.

Referring to FIG. 6A, in the case where the connection interface 210, 220, and/or 310 is in the open state, if a waveform transmitted from a high-speed transmission buffer 321 of the processor 120 or 320 reaches a point of the connection interface 210, 220, and/or 310 at which an open circuit occurs at a time (T), a reflected wave having the same size as the output of the high-speed transmission buffer 321 may occur earlier than the time taken to reach the off-board electronic component to be inspected 330 (a time (TC) taken for a signal transmitted from a transmission end to be transmitted to a reception end) (e.g., 2 nsec).

Accordingly, since a reflected wave having the same period and size as the output signal waveform of the high-speed transmission buffer 321 occurs, but staggered by less than one period, e.g., indicated by 607, a waveform 605 having a peak amplitude twice that of the output signal waveform of the high-speed transmission buffer 321 may be monitored in the low-power reception buffer 324 at a time point (e.g., 2 nsec+607) (hereinafter, referred to as "2 T") preceding a time point (e.g., 2 nsec+608) that corresponds to one period (e.g., 4 nsec) from the time point at which a 0.5 V inspection signal is output from the high-speed transmission buffer 321. Accordingly, it may be estimated that an open circuit occurs at a location that requires ½ the time indicated by 607 to receive the inspection signal.

Referring to FIG. 6B, in the case where the connection interface 210, 220, and/or 310 is in the short state, if a waveform transmitted from a high-speed transmission buffer 321 of the processor 120 or 320 reaches a point of a short circuit, a reflected wave which has the same size as that of and has a phase opposite (−) to the output of the high-speed transmission buffer 321 may occur before the time taken to reach the off-board electronic component to be inspected 330 (the time taken for a signal transmitted from a transmission end to be transmitted to a reception end) has passed. Accordingly, since a reflected wave which has the same amplitude and phase opposite (−) to the output of the high-speed transmission buffer 321 occurs and an output waveform of the high-speed transmission buffer 321 and a reflected waveform input to the low-power reception buffer 324 offset each other through the connection interface 210, 220, and/or 310, a 0 V waveform 615 may be monitored in the low-power reception buffer 324 at a time point (e.g., 2 nsec+617), i.e., a time point after 2 T, preceding a time point (e.g., 2 nsec+618) which corresponds to one period (e.g., 4 nsec) from the time point at which a 0.5 V inspection signal is output from the high-speed transmission buffer 321.

Further, in the case where the connection interface 210, 220, and/or 310 is connected normally, during a time taken for a signal transmitted from a transmission end to be transmitted to a reception end, that is, at a time point corresponding to a half (½) period (TC), if the output of the high-speed transmission buffer 321 is changed to 0.5 V, and then, at a time point after TC 618, the output of the high-speed transmission buffer 321 is changed to 0 V again, the level of the input signal of the low-power reception buffer 324 may be −0.5 V at 2 TC (e.g., 4 nsec) due to the reflected wave. Accordingly, if it is monitored that the level of the input signal of the low-power reception buffer 324 is −0.5 V at 2 TC, it may be identified that a waveform having a phase opposite to that of the output signal waveform is input to the low-power reception buffer 324 at a time point (e.g., 2 nsec+617) at which it is previously monitored that the input signal level is 0 V, i.e., at 2 T. Therefore, it may be estimated that a short circuit occurs in one point on the connection interface 210, 220, or 310 at a time point (T) halfway (½) to the time point (e.g., 2 nsec+617) at which 0 V is monitored.

According to certain embodiments, if the connection interface 210, 220, and/or 310 is connected normally, the processor 120 or 320 may configure the frequency of an inspection signal to be transmitted based on the time taken for a signal transmitted from a transmission end to be transmitted to a reception end, and may determine the waveform of the inspection signal based on the state (e.g., an on or off state) of the off-board electronic component to be inspected 330.

When the state of the module to be inspected 330 is the "ON" state, the processor 120 or 320 may not separately measure the time taken for a reflected wave to reach the low-power reception buffer 324, and may immediately determine that the connection state of the connection interface 210, 220, and/or 310 is the open or short state if a signal, the level of which is lower or higher than a reference voltage preconfigured based on the size of the reflected wave reaching the low-power reception buffer 324, that is, based on the level of an input signal of the low-power reception buffer 324 only is detected even once.

For example, a reference voltage for determining the open state of the connection interface 210, 220, and/or 310 may be configured to be a value between Vswing and 2*Vswing (for example, a reference value 609 of FIG. 6A, 1.6*Vswing, e.g., 0.8 V).

For example, a reference voltage for determining the short state of the connection interface 210, 220, and/or 310 may be configured to be a value between 0 V and Vswing (for example, a reference value 619 of FIG. 6B, −0.4*Vswing, e.g., −0.2 V).

Therefore, if the voltage level received in the low-power reception buffer 324 is exceeds 0.80 V at any time during the time period 2*TC (4 nsec) following transmission of the inspection signal, the connection interface 210, 220, and/or 310 can be considered in an open state.

If the voltage level received in the low-power reception buffer 324 is lower than −0.2V at any time during the time period 2*TC (4 nsec) following transmission of the inspection signal, the connection interface 210, 220, and/or 310 can be considered in a short state.

If the voltage remains between −0.2 and 0.80 V, the connection interface 210, 220, and/or 310 can be considered in a normal state.

According to an embodiment, if the module to be inspected 330 is in the "OFF" state (inactive state), in the state in which the connection interface 210, 220, and/or 310 is connected normally, as shown in FIGS. 6A and 6B and Table 1 below, for example, once 2 TC passes after a 0.5 V signal waveform is output from the high-speed transmission buffer 321, a 0.5 V reflected wave having the same size as that of the output signal waveform may reach the low-power reception buffer 324. At this point, if the output waveform of the high-speed transmission buffer is changed to 0 V, a 0.5 V reception signal may be detected from the low-power reception buffer 324.

TABLE 1

| | Position-specific voltage/time | | | | |
|---|---|---|---|---|---|
| | 0 | 2 TC | 4 TC | 2n TC | 4n TC |
| (1) Output voltage of high-speed transmission buffer 321 | 0.5 V | 0 V | 0.5 V | 0 V | 0.5 V |
| (2) Reflected wave having reached low-power reception buffer 324 | 0 V | 0.5 V | 0 V | 0.5 V | 0 V |
| (3) Input voltage of low-power reception buffer 324 = (1) + (2) | 0.5 V | 0.5 V | 0.5 V | 0.5 V | 0.5 V |

Table 1 shows values obtained over time by measuring the voltage of a signal over time with reference to a reference time (0) and a time (TC) taken for a signal output from the processor 120 or 320 to reach the module to be inspected 330. For example, the output voltage level of the high-speed transmission buffer 321, the voltage level of the reflected wave having reached the low-power reception buffer 324, and the input voltage level of the low-power reception buffer 324 may be compared to one another over time.

According to an embodiment, in the state in which the connection interface 210, 220, and/or 310 is connected normally, as time passes, at the absolute time 0, 0.5 V (High-voltage) may be output from the high-speed transmission buffer 321 of the processor 120 or 320. In this case, a 0.5 V input voltage may be detected from the low-power reception buffer 324 of the processor 120 or 320.

According to an embodiment, at the absolute time TC, the 0.5 V voltage signal which has been output from the high-speed transmission buffer 321 of the processor 120 or 320 reaches the module to be inspected 330, and the module to be inspected 330 is not being supplied with power at that time. Accordingly, a 0.5 V reflected wave may occur in the module to be inspected 330 as an open impedance (open termination) state and may be reversely transmitted in the direction toward the processor 120 or 320.

According to an embodiment, at the absolute time 2 TC, the reflected wave may arrive at the input of the low-power reception buffer 324 of the processor 120 or 320. In this case, the high-speed transmission buffer 321 of the processor 120 or 320 may change the output from 0.5 V (High-voltage) to 0 V (Low-voltage). The output signal voltage (0 V) of the high-speed transmission buffer 321 of the processor 120 or 320 is added to the reflected wave (0.5 V) received at 2 TC, and a 0.5 V voltage signal may be input to the low-power reception buffer 324 of the processor 120 or 320.

According to an embodiment, at the absolute time 3 TC, the signal waveform output at 2 TC from the high-speed transmission buffer 321 of the processor 120 or 320 may arrive at the module to be inspected 330 and a reflected wave having the same size as the above-described signal waveform may occur and may be reversely transmitted in the direction toward the processor 120 or 320.

According to an embodiment, at the absolute time 4 TC, the reflected wave may arrive at the input of the low-power reception buffer 324 of the processor 120 or 320. In this case, the high-speed transmission buffer 321 of the processor 120 or 320 may change the output from 0.5 V (High-voltage) to 0 V (Low-voltage), and the reflected wave occurring at 3 TC may be input to the low-power reception buffer 324 of the processor 120 or 320. That is, at 4 TC, the output of the high-speed transmission buffer 321 of the processor 120 or 320 is added to the reflected wave occurring at 3 TC and received at 4 TC, and a 0.5 V voltage signal may be detected from the low-power reception buffer 324 of the processor 120 or 320.

According to an embodiment, if a signal waveform output from the high-speed transmission buffer 321 reaches the point at which an open or short circuit has occurred before being received by the module to be inspected 330, a reflected wave occurring at that time may be received by the low-power reception buffer 324 earlier than 2 TC. Accordingly, for example, a voltage not having the size of 0.5 V, in one example, a 1 V voltage reception signal in the case of the open state, and in another example, a −0.5 V voltage reception signal in the case of the short state, may be detected from the low-power reception buffer 324.

In FIG. 6A, the low-power reception buffer 324 of the processor 120 or 320 in the case in which the processor 120 or 320 and the module to be inspected 330 are connected normally may receive substantially the same level of signal waveform despite the passage of time, for example, a 0.5 V level of signal waveform 603.

According to an embodiment, if the processor 120 or 320 and the module to be inspected 330 are connected abnormally, for example, if the connection interface 210, 220, and/or 310 is in the open state, as shown in the following Table 2, the low-power reception buffer 324 of the processor 120 or 320 may receive a signal waveform over time, for example, a signal waveform 605, the level of which changes to 0 V, 0.5 V, and 1 V levels.

TABLE 2

| Position-specific voltage/time | 0 | 2 T | 2 TC + 2 T |
|---|---|---|---|
| (1) Output voltage of high-speed transmission buffer 321 | 0.5 V | 0.5 V | 0 V |
| (2) Reflected wave having reached low-power reception buffer 324 | 0 V | 0.5 V | 0 V |
| (3) Input voltage of low-power reception buffer 324 = (1) + (2) | 0.5 V | 1.0 V | 0 V |

Table 2 shows values obtained over time by measuring the voltage of a signal over time with reference to a reference time (0) and the time (TC) taken for a signal output from the processor 120 or 320 to reach the module to be inspected 330 or the time (T) taken to reach the point at which an open circuit has occurred. For example, the output voltage level of the high-speed transmission buffer 321, the voltage level of the reflected wave having reached the low-power reception buffer 324, and the input voltage level of the low-power reception buffer 324 may be compared to one another over time.

According an embodiment, in the state in which the connection interface 210, 220, and/or 310 is in the open state, as time passes, 0.5 V (High-voltage) may be output from the high-speed transmission buffer 321 of the processor 120 or 320 at the absolute time 0. In this case, a 0.5 V input voltage may be detected from the low-power reception buffer 324 of the processor 120 or 320.

According to an embodiment, at the absolute time T, the 0.5 voltage signal that has been output from the high-speed transmission buffer 321 of the processor 120 or 320 may arrive at the point in the open state (one point on the connection interface 210, 220, and/or 310 connecting the processor 120 or 320 and the module to be inspected 330). In this case, a 0.5 V reflected wave may occur at the point in the open state and may be reversely transmitted in the direction toward the processor 120 or 320.

According to an embodiment, at the absolute time 2 T, the reflected wave may arrive at the input of the low-power reception buffer 324 of the processor 120 or 320. In this case, the high-speed transmission buffer 321 of the processor 120 or 320 maintains the output at 0.5 V (High-voltage). Accordingly, the output signal voltage of the high-speed transmission buffer 321 of the processor 120 or 320 is added to the reflected wave occurring at time T above and a 1 V voltage signal may be detected from a low-power reception buffer 324 of the processor 120 or 320.

According to an embodiment, at the absolute time 2 TC, a 0.5 V (High-voltage) signal may be changed to a 0 V (Low-voltage) signal in the high-speed transmission buffer 321 of the processor 120 or 320 and the changed signal may be maintained until 4 TC.

According to an embodiment, at the absolute time 2 TC+2 T, a 0 V voltage signal is output from the high-speed transmission buffer 321 of the processor 120 or 320, the reflected wave is also 0 V, and a 0 V reception voltage signal may be detected from the low-power reception buffer 324.

According to an embodiment, the low-power reception buffer 324 may configure, for example, a value between 0.5 V and 1 V to be a reference voltage of the logical determination operation of the processor 120 or 320 for determining the open state of the connection interface 210, 220, and/or 310. In this case, if the connection interface 210, 220, and/or 310 is connected normally, the output value of the logical determination operation of the processor 120 or 320 may be 0. If the connection interface 210, 220, and/or 310 is in the open state, the output value of the logical determination operation of the processor 120 or 320 may alternate between 0 and 1. Accordingly, if the processor 120 or 320 outputs an output value of the logical determination operation as 1, not as 0 even once, it may be determined that the connection interface 210, 220, or 310 is in the open state.

As shown in FIG. 6B, if the processor 120 or 320 and the module to be inspected 330 are connected abnormally, for example, if the connection interface 210, 220, and/or 310 is in the short or ground state, as shown in the following Table 3, the low-power reception buffer 324 of the processor 120 or 320 may receive, like the reception signal waveform 615, for example, a signal waveform, the level of which changes into three levels, i.e., the 0.5 V, 0 V, and −0.5 V levels.

TABLE 3

| Position-specific voltage/time | 0 | 2 T | 2 TC |
|---|---|---|---|
| (1) Output voltage of high-speed transmission buffer 321 | 0.5 V | 0.5 V | 0 V |
| (2) Reflected wave having reached low-power reception buffer 324 | 0 V | −0.5 V | −0.5 V |
| (3) Input voltage of low-power reception buffer 324 = (1) + (2) | 0.5 V | 0 V | −0.5 V |

Table 3 shows values obtained over time by measuring the voltage of a signal over time with reference to a reference time (0) and the time (TC) taken for a signal output from the processor 120 or 320 to reach the module to be inspected 330. For example, the output voltage level of the high-speed transmission buffer 321, the voltage level of the reflected wave having reached the low-power reception buffer 324, and the input voltage level of the low-power reception buffer 324 may be compared to one another over time.

According an embodiment, in the state in which the connection interface 210, 220, and/or 310 is in the short state, as time passes, 0.5 V (High-voltage) may be output from the high-speed transmission buffer 321 of the processor 120 or 320 at the absolute time 0. In this case, a 0.5 V reception signal may be detected from the low-power reception buffer 324 of the processor 120 or 320.

According to an embodiment, at the absolute time T, the 0.5 voltage signal which has been output from the high-speed transmission buffer 321 of the processor 120 or 320 may arrive at the point of the short state (one point on the connection interface 210, 220, or 310 connecting the processor 120 or 320 and the module to be inspected 330). In this case, a −0.5 V reflected wave may occur at the point of the short state and may be reversely transmitted in the direction toward the processor 120 or 320.

According to an embodiment, at the absolute time 2 T, the −0.5 V reflected wave may arrive at the input of the low-power reception buffer 324 of the processor 120 or 320. In this case, the high-speed transmission buffer 321 of the processor 120 or 320 maintains the output at 0.5 V (High-voltage). Accordingly, the output signal voltage of the high-speed transmission buffer 321 of the processor 120 or 320 is added to the −0.5 V reflected wave which occurs at time T above, and a 0 V voltage signal may be detected from the low-power reception buffer 324 of the processor 120 or 320.

According to an embodiment, at the absolute time 2 TC, a 0.5 V (High-voltage) signal may be changed from a 0.5 V (High-voltage) signal to a 0 V (Low-voltage) signal in the high-speed transmission buffer 321 of the processor 120 or 320 and the changed signal may be maintained until 4 TC.

According to an embodiment, at the absolute time 2 TC+2 T, a 0 V voltage signal is output from the high-speed transmission buffer 321 of the processor 120 or 320, the reflected wave is −0.5 V, and a −0.5 V reception voltage may be detected from the low-power reception buffer 324.

According to an embodiment, for the low-power reception buffer 324, for example, a value between −0.5 V and 0 V may be configured to be a reference voltage of the logical determination operation of the processor 120 or 320 for determining the short state of the connection interface 210, 220, and/or 310. In this case, if the connection interface 210, 220, and/or 310 is connected normally, the output value of the logical determination operation of the processor 120 or 320 may be always 1. If the connection interface 210, 220, or 310 is in the ground or short state, an output value of the logical determination operation may be alternatively output as 0 and 1. Accordingly, if the processor 120 or 320 outputs an output value of the logical determination operation as 0, not as 1 even once, it may be determined that the connection interface 210, 220, or 310 is in the ground or short state.

Meanwhile, if the processor 120 or 320 and the module to be inspected 330 are connected abnormally, for example, if a short circuit occurs between a signal line to be inspected of the connection interface 210, 220, and/or 310 and a neighboring signal line, similar to the case of the open state, the low-power reception buffer 324 may receive, for example, three signal waveforms at 0 V, 0.5 V, and 1 V, respectively. Accordingly, the low-power reception buffer 324 may configure, for example, a value between 0.5 V and 1 V to be a reference voltage of the logical determination operation of the processor 120 or 320 for determining the short state between the signal line to be inspected and the other signal lines of the connection interface 210, 220, and/or 310. In this case, if the connection interface 210, 220, and/or 310 is normally connected, an output value of the logical determination operation of the processor 120 or 320 may be 0. If a short circuit occurs between the connection interface 210, 220, or 310 and the other signal lines, the output value of the logical determination operation may be alternate between 0 and 1. Accordingly, when the processor 120 or 320 outputs an output value of the logical determination operation as 1, not as 0 even once, it may be determined that the corresponding signal line to be inspected and the other signal lines of the connection interface 210, 220, or 310 are in the short state.

Figure 7B:
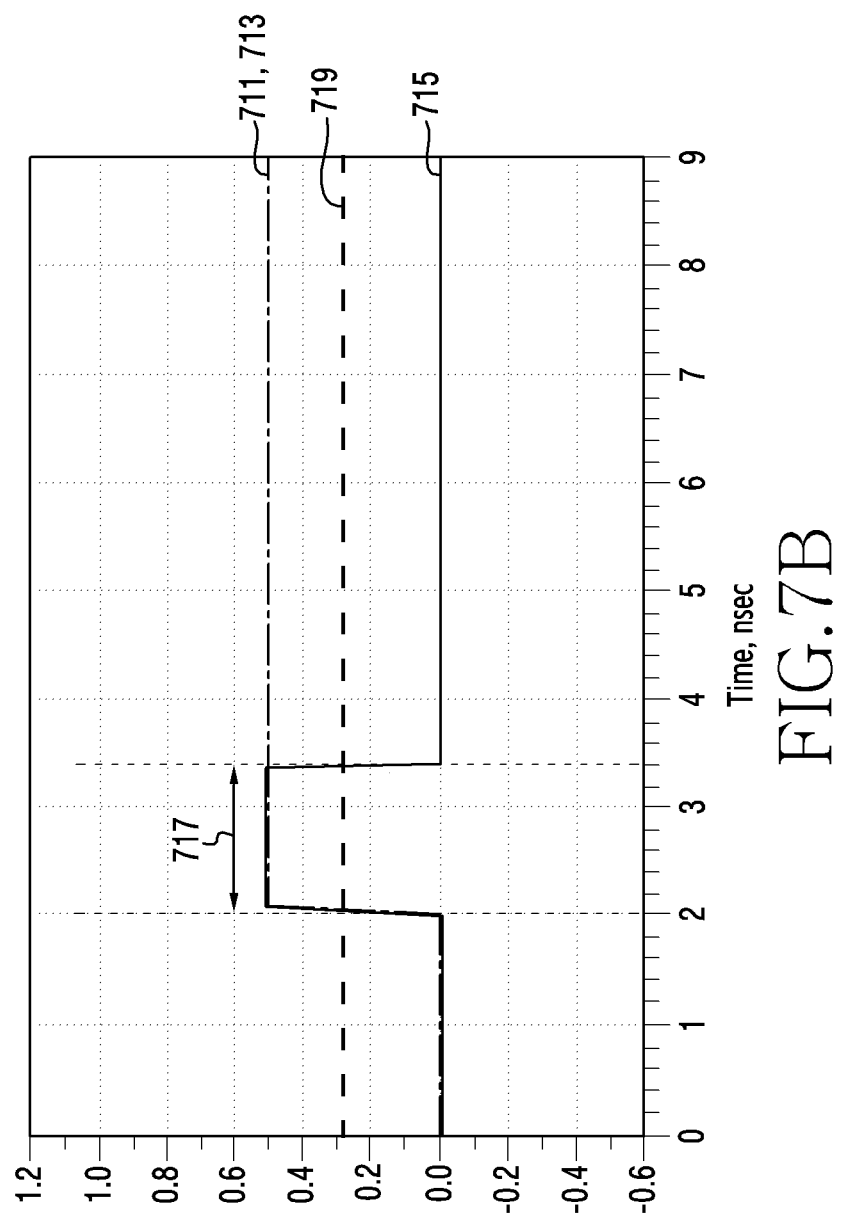
FIG. 7B illustrates another example of a reception voltage for describing another example of an operation of inspecting a connection interface of an electronic device according to certain embodiments.

FIG. 7A illustrates another example of a reception voltage for describing another example of an operation of inspecting a connection interface of an electronic device according to certain embodiments, and FIG. 7B illustrates another example of a reception voltage for describing another example of an operation of inspecting a connection interface of an electronic device according to certain embodiments. The graphs shown in the drawing indicate the voltage level of a signal received by the processor 120 or 320 over time after an inspection signal is transmitted through a connection interface (e.g., the connection interface 210, 220, and/or 310 of FIG. 2 and/or FIG. 3) from the electronic device 101 or the processor 120 or 320 of the electronic device 101, illustrated in FIG. 1, FIG. 2, and FIG. 3.

FIGS. 7A and 7B may correspond to embodiments of the case in which an off-board electronic component to be inspected (e.g., the display device 160 or the camera module 180 of FIG. 1 and FIG. 2 or the module to be inspected 330 of FIG. 3) is in a power-on (active) state. In such a case, impedance (termination or a resistance value) of a high-speed reception buffer (e.g., the high-speed reception buffer 331 of FIG. 3) is enabled, and indicates, for example, a 50-ohm pull-down resistance value.

FIGS. 7A and 7B describe embodiments of the case in which a off-board electronic component to be inspected 330 is in a power-on state, for example, the case in which power is supplied to a high-speed reception buffer (e.g., the high-speed reception buffer 331 of FIG. 3).

The processor (e.g., the processor 120 or 320 of FIG. 1, FIG. 2, and FIG. 3) may enable impedance of the high-speed reception buffer (e.g., the high-speed reception buffer 331) (for example, enable a 50 ohm pull-down resistance value) after the power of the module to be inspected 330 is turned on, and may determine whether the connection interface 210, 220, and/or 310 is connected normally by monitoring the size of a reflected wave only, irrespective of the transmission time of the reflected wave occurring according to the connection state of the connection interface (e.g., the connection interface 210, 220, and/or 310 of FIG. 2 or FIG. 3).

The processor 120 or 320 may inspect the connection state of the connection interface 210, 220, and/or 310 after the module to be inspected 330 is turned on, for example, before the module to be inspected 330 is normally operated, before normal operation is performed again in the case where the module to be inspected 330 is temporally stopped, or before an app for normal operation of the module to be inspected 330 is executed.

Referring to FIGS. 7A and 7B, a signal waveform 701 or 711 corresponding to a bit pattern of 1111 . . . of an inspection signal output from the processor 120 or 320 over time and a signal waveform 703 or 713 of a signal input into the processor 120 or 320 in the case of a normal connection are illustrated using dashed lines. A signal waveform 705 or 715 input into the processor 120 or 320 in the case in which the connection interface 210, 220, and/or 310 is in an open or short state is illustrated using a solid line.

According to certain embodiments, if the module to be inspected 330 is in the power-on (active) state, the processor 120 or 320 may output an inspection signal in a signal waveform 701 or 711 constantly maintained at the 0.5 V level over time such as the bit pattern "0, 1, 1, 1, . . . " according to a configured period.

When the connection interface 210, 220, and/or 310 is connected normally, a signal line of the connection interface 210, 220, and/or 310 and the impedance of the off-board electronic device to be inspected 330 are matched, and a reflected wave may not occur. Accordingly, the voltage level of the signal waveform 703 or 713 received by the low-power reception buffer 324 of the processor 120 or 320 may be the same as the voltage level of the output signal waveform 701 or 711 of the high-speed transmission buffer 321. In this case, the processor 120 or 320 may maintain the output of the voltage signal at the same level (e.g., 0.5 V).

Referring to FIG. 7A, in the case in which an open circuit occurs in the connection interface 210, 220, and/or 310, if a waveform transmitted from the high-speed transmission buffer 321 of the processor 120 or 320 reaches the point of an open state of the interface 210, 220, and/or 310 at a time (T), a reflected wave having the same size as that of the output of the high-speed transmission buffer 321 may occur earlier than the time at which the off-board electronic component to be inspected 330 is reached (a time (TC) taken for a signal transmitted from a transmission end to be transmitted to a reception end (e.g., 2 nsec)). Accordingly, since a reflected wave having the same size as that of the output signal waveform of the high-speed transmission buffer 321 occurs, a waveform 705 having a size twice that of the output signal waveform of the high-speed transmission buffer 321 may be monitored in the low-power reception buffer 324 at a time point after 2 T (e.g., 2 nsec+707) from a time point at which a 0.5 V inspection signal is output from the high-speed transmission buffer 321. Accordingly, it may be estimated that an open circuit occurs in one point on the connection interface 210, 220, or 310 at a time point (e.g., time T) halfway (½) to a time point (e.g., 2 nsec+707) at which a waveform 705 having a size twice that of the output signal waveform is monitored.

Referring to FIG. 7B, if a waveform transmitted from the high-speed transmission buffer 321 of the processor 120 or 320 reaches a point where a short circuit occurs at a time (T), a reflected wave which has the same size as that of and has a phase opposite (−) to the output of the high-speed transmission buffer 321 may occur before the time (TC) taken to reach the module to be inspected 330 (the time taken for a signal transmitted from a transmission end to be transmitted to a reception end) has passed. Accordingly, if the connection interface 210, 220, and/or 310 is in the short state, a reflected wave which has the same size as that of and has a phase opposite (−) to the output of the high-speed transmission buffer 321 occurs and an output waveform and a reflected waveform of the high-speed transmission buffer 321 offset each other through the connection interface 210, 220, and/or 310, a 0 V waveform 715 may be monitored in the low-power reception buffer 324 at a time point after 2 T (e.g., 2 nsec+707) from the time point at which a 0.5 V inspection signal is output from the high-speed transmission buffer 321. Accordingly, if it is monitored that the level of an input signal of the low-power reception buffer 324 is 0 V after 2 T, it may be identified that a waveform having a phase opposite to the output signal waveform is input. Therefore, it may be estimated that a short circuit occurs in one point on the connection interface 210, 220, or 310 at a time point (e.g., time T) halfway (½) to a time point (e.g., 2 nsec+717) at which 0 V is monitored.

Accordingly, if the voltage monitored at the low-power reception buffer 324 at any point during the time TC after transmission of the inspection signal come within a threshold of 2*0.5V, or 1 V, the processor 120, 320 can determine an open circuit state of the connection interface 210, 220, and/or 310.

If the voltage monitored at the low-power reception buffer 324 at any point during the time TC after transmission of the inspection signal come within a threshold of 0 V, the processor 120, 320 can determine an short circuit state of the connection interface 210, 220, and/or 310.

According to an embodiment, if the connection interface 210, 220, and/or 310 is connected normally, as shown in FIGS. 7A and 7B and Table 4 below, in the high-speed transmission buffer 321, for example, a reflected wave may not occur after a 0.5 V signal waveform is output, and thus a 0.5 V level of an input signal having the same size as that of the output signal waveform may be detected from the low-power reception buffer 324 as below.

TABLE 4

| Position-specific voltage/time | 0 | After 2 TC |
|---|---|---|
| (1) Output voltage of high-speed transmission buffer 321 | 0.5 V | 0.5 V |
| (2) Reflected wave having reached low-power reception buffer 324 | 0.0 V | 0.0 V |
| (3) Input voltage of low-power reception buffer 324 = (1) + (2) | 0.5 V | 0.5 V |

Table 4 shows values obtained over time by measuring the voltage of a signal over time with reference to a reference time (0) and the time (TC) taken for a signal output from the processor 120 or 320 to reach the module to be inspected 330. For example, the output voltage level of the high-speed transmission buffer 321, the voltage level of the reflected wave having reached the low-power reception buffer 324, and the input voltage level of the low-power reception buffer 324 may be compared to one another over time.

According to an embodiment, in the state in which the connection interface 210, 220, and/or 310 is connected normally, as time passes, 0.5 V (High-voltage) may be output from the high-speed transmission buffer 321 of the processor 120 or 320 at the absolute time 0. In this case, a 0.5 V input voltage may be detected from the low-power reception buffer 324 of the processor 120 or 320.

According to an embodiment, at the absolute time TC, since the 0.5 V voltage signal that has been output from the high-speed transmission buffer 321 of the processor 120 or 320 arrives at the module to be inspected 330 and the module to be inspected 330 is supplied with power, impedance is matched for the module to be inspected 330 and a reflected wave may not occur.

According to an embodiment, additionally, after the absolute time 2 TC, since a reflected wave may not occur for the transmission inspection signal having reached the module to be inspected 330, only a 0.5 V voltage output from the high-speed transmission buffer 321 of the processor 120 or 320 may be detected from the input of the low-power reception buffer 324 of the processor 120 or 320.

Referring to FIG. 7A, the low-power reception buffer 324 of the processor 120 or 320 in the case where the processor 120 or 320 and the module to be inspected 330 are connected normally (e.g., a power-on state) may receive substantially the same level of signal waveform despite the passage of time, for example, a 0.5 V level of signal waveform 703.

According to an embodiment, if the processor 120 or 320 and the module to be inspected 330 are connected abnormally, for example, if the connection interface 210, 220, and/or 310 is in the open state, as shown in the following Table 5, the low-power reception buffer 324 of the processor 120 or 320 may a receive signal waveform over time, for example, a signal waveform 705, the level of which changes from the 0.5 V level to the 1 V level and then is maintained at the 1 V level.

TABLE 5

| Position-specific voltage/time | 0 | After 2 T |
|---|---|---|
| (1) Output voltage of high-speed transmission buffer 321 | 0.5 V | 0.5 V |
| (2) Reflected wave having reached low-power reception buffer 324 | 0 V | 0.5 V |
| (3) Input voltage of low-power reception buffer 324 = (1) + (2) | 0.5 V | 1.0 V |

Table 5 shows values obtained over time by measuring the voltage of a signal according to a time with reference to a reference time (0) and the time (T) taken for a signal output from the processor 120 or 320 to reach the point an open circuit has occurred. For example, the output voltage level of the high-speed transmission buffer 321, the voltage level of the reflected wave having reached the low-power reception buffer 324, and the input voltage level of the low-power reception buffer 324 may be compared to one another over time.

According to an embodiment, in the state in which the connection interface 210, 220, and/or 310 is in the open state, as time passes, 0.5 V (High-voltage) may be output from the high-speed transmission buffer 321 of the processor 120 or 320 at the absolute time 0. In this case, a 0.5 V input voltage may be detected from the low-power reception buffer 324 of the processor 120 or 320.

According to an embodiment, at the absolute time T, since the 0.5 V voltage signal that has been output from the high-speed transmission buffer 321 of the processor 120 or 320 may arrive at a point at which an open circuit has occurred (one point on the connection interface 210, 220, and/or 310 connecting the processor 120 or 320 or the module to be inspected 330), a 0.5 V reflected wave may occur at the point in the open state and may be reversely transmitted in the direction toward the processor 120 or 320.

According to an embodiment, after the absolute time 2 T, the reflected wave may arrive at the input of the low-power reception buffer 324 of the processor 120 or 320. In this case, since the high-speed transmission buffer 321 of the processor 120 or 320 maintains the output at 0.5 V (High-voltage), the output signal voltage of the high-speed transmission buffer 321 of the processor 120 or 320 is added to the reflected wave which occurs at time T above and a 1 V voltage signal may be detected from the low-power reception buffer 324 of the processor 120 or 320.

As shown in FIG. 7B, if the processor 120 or 320 and the module to be inspected 330 are connected abnormally, for example, if the connection interface 210, 220, and/or 310 is the short or ground state, as shown in the following Table 6, the low-power reception buffer 324 of the processor 120 or 320 may receive a signal waveform, the level of which is maintained at, for example, the 0 V level after a predetermined time, like the reception signal waveform 715.

TABLE 6

| Position-specific voltage/time | 0 | After $2^T$ |
|---|---|---|
| (1) Output voltage of high-speed transmission buffer 321 | 0.5 V | 0.5 V |
| (2) Reflected wave having reached low-power reception buffer 324 | 0 V | −0.5 V |
| (3) Input voltage of low-power reception buffer 324 = (1) + (2) | 0.5 V | 0.0 V |

Table 6 shows values obtained over time by measuring the voltage of a signal over time with reference to a reference time (0) and the time (TC) taken for a signal output from the processor 120 or 320 to reach the module to be inspected 330 or the time (T) taken to reach a point at which a short circuit has occurred. For example, the output voltage level of the high-speed transmission buffer 321, the voltage level of the reflected wave having reached the low-power reception buffer 324, and the input voltage level of the low-power reception buffer 324 may be compared to one another over time.

For example, in the state in which the connection interface 210, 220, and/or 310 is in the short state, as time passes, 0.5 V (High-voltage) may be output from the high-speed transmission buffer 321 of the processor 120 or 320 at the absolute time 0. In this case, a 0.5 V input voltage may be detected from the low-power reception buffer 324 of the processor 120 or 320.

For example, at the absolute time T, the 0.5 voltage signal which has been output from the high-speed transmission buffer 321 of the processor 120 or 320 may arrive at the point of the short state (one point on the connection interface 210, 220, and/or 310 connecting the processor 120 or 320 and the module to be inspected 330). In this case, a −0.5 V reflected wave may occur at the point at which a short circuit has occurred and may be reversely transmitted in the direction toward the processor 120 or 320.

For example, after the absolute time 2 T, the −0.5 V reflected wave may arrive at the input of the low-power reception buffer 324 of the processor 120 or 320. In this case, since the high-speed transmission buffer 321 of the processor 120 or 320 maintains the output of the high-speed transmission buffer 321 of the processor 120 or 320 at 0.5 V (High-voltage), the output signal voltage of the high-speed transmission buffer 321 of the processor 120 or 320 is added to the −0.5 V reflected wave which occurs at time T above, and a 0 V voltage signal may be detected from the low-power reception buffer 324 of the processor 120 or 320.

For example, a reference voltage for determining the open state of the connection interface 210, 220, and/or 310 may be configured to be a value between Vswing and 2*Vswing (for example, a reference value 709 of FIG. 7A, 1.7*Vswing).

For example, a reference voltage for determining the short state of the connection interface 210, 220, and/or 310 may be configured to be a value between 0 V and Vswing (for example, a reference value 719 of FIG. 7B, 0.6*Vswing).

Figure 8:
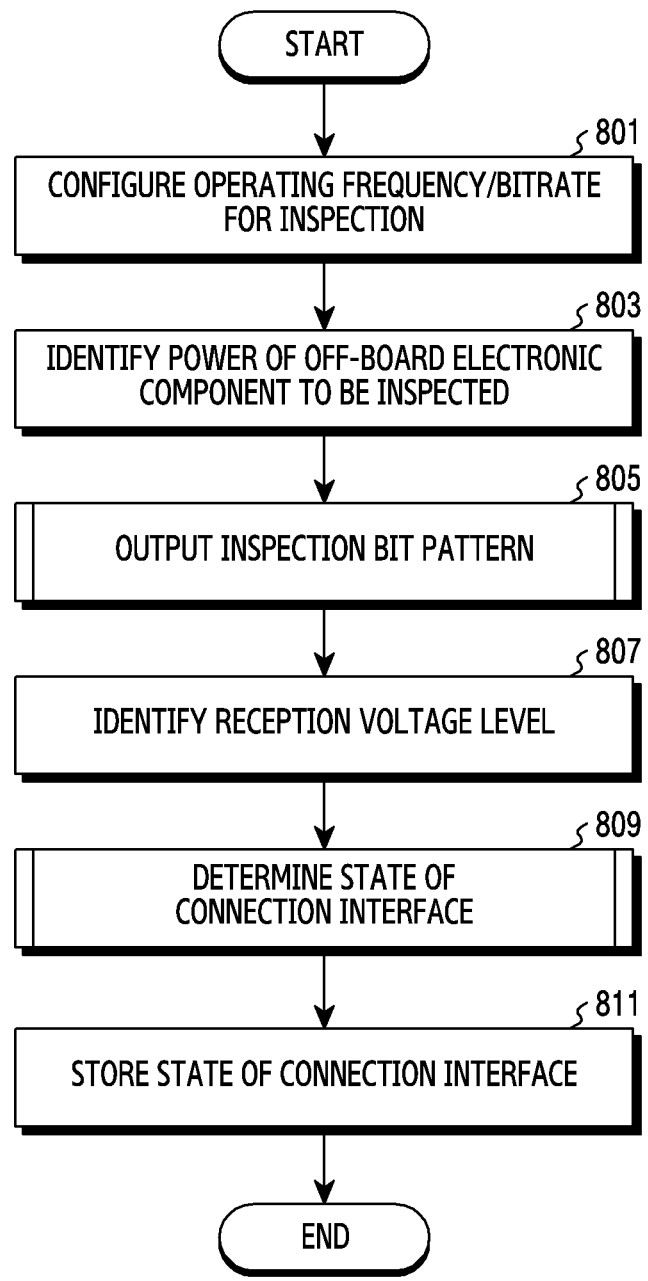
FIG. 8 illustrates another example of an operation of an electronic device according to certain embodiments.

FIG. 8 illustrates another example of the operation of an electronic device according to certain embodiments. The operation may be performed by the electronic device 101 or at least one component (e.g., the processor 120 or 320 or the connection interface 210, 220, and/or 310) included in the electronic device 101, illustrated in FIG. 1, FIG. 2, and FIG. 3.

Referring to FIG. 8, in operation 801, the processor 120 or 320 may configure the bitrate of a signal to be transmitted to an off-board electronic component to be inspected (e.g., the display device 160 or the camera module 180 of FIG. 1 or FIG. 2 or the off-board electronic component to be inspected 330 of FIG. 3) of the electronic device 101.

For example, the frequency or bitrate of the inspection signal output from the processor 120 or 320 may be configured differently from the operating bitrate or frequency of a data signal transmitted or received by the processor 120 or 320 according to the general operation control of the display device 160. For example, the operating bitrate or frequency of the inspection signal may be configured to be the reciprocal of a value equal to twice the amount of time taken for a signal transmitted from the processor 120 or 320 to be transmitted to a final end of the off-board electronic component to be inspected 330 through the connection interface 210, 220, and/or 310. To this end, a determination may be performed by measuring the time taken for a transmitted signal to be transmitted to a final end of the off-board electronic component to be inspected 330 through the connection interface 210, 220, and/or 310, or the value stored in a table configured based on the value of a time predetermined according to types of the connection interface 210, 220, and/or 310 may be used. In this case, the voltage level of the inspection signal output from the processor 120 or 320 may be configured the same as the voltage level of a general operation signal.

In operation 803, the processor may identify a power-on or power-off (or active/inactive) state of the off-board electronic component to be inspected 330.

In operation 805, the processor 120 or 320 may output an inspection bit pattern to the high-speed transmission buffer 321 based on the configured bitrate and/or voltage level and transmit the inspection signal according to the inspection bit pattern from the high-speed transmission buffer 321 to the off-board electronic component to be inspected 330 through the connection interface 310.

According to certain embodiments, the bit pattern of the inspection signal may be configured differently depending on the power-on/off state of the off-board electronic component to be inspected 330.

According to certain embodiments, the display device 160 or the camera module 180 which is the off-board electronic component to be inspected 330 is in the power-off (inactive) state, the processor 120 or 320 may output a bit pattern periodically changing based on the configured bitrate, for example, changing over time, like "101010 . . . " or "010101 . . . ". This case may correspond to, for example, the case where no power is supplied to the high-speed reception buffer (e.g., the high-speed reception buffer 331 of FIG. 3) of the display device 160 or the camera module 180.

For example, if the display device 160 or the camera module 180, which is the off-board electronic component to be inspected 330, is in the power-off (inactive) state, for example, a 0.5 V signal waveform may be output from the high-speed transmission buffer 321 at a first start time point 0 with reference to a time corresponding to a time twice as long as the time taken (TC) for a signal waveform output from the processor 120 or 320 to reach the off-board electronic component to be inspected 330 and for a reflected wave to return again to the processor 120 or 320, i.e., a time corresponding to one period of the configured frequency, and the output waveform of the high-speed transmission buffer 321 may be changed to 0 V at a time point after TC, which is half (½) of a frequency period. The waveform level of the transmission signal may be configured to be periodically changed according to the configured bit rate.

According to certain embodiments, if the display device 160 or the camera module 180, which is the off-board electronic component to be inspected 330, is in the on (active) state, the processor 120 or 320 may output, based on the configured bit rate, a bit pattern not changing over time, for example, "111111 . . . " or "011111 . . . ". This case may correspond to, for example, the case where power is supplied to the high-speed reception buffer 331.

For example, from the high speed transmission buffer 321, a 0.5 V signal waveform, for example, may be continuously output without being changed during an inspection period after time 0, based on the configured bit rate.

For example, a 0.5 V signal waveform may be continuously output during an inspection period after a 0 V signal waveform is output at time 0 and then a 0.5 V signal waveform is output at time TC, based on the configured bit rate.

In operation 807, the processor 120 or 320 may identify the voltage level of the received signal. For example, the processor 120 or 320 may monitor an input signal of the low-power reception buffer 324 and identify the voltage level of the input signal.

In operation 809, the processor 120 or 320 may determine the connection state of the connection interface 210, 220, and/or 310 based on the identified level of the reception voltage.

According to certain embodiments, the processor 120 or 320 may compare the voltage level of a reception signal of the processor 120 or 320 with a first reference voltage and/or a second reference voltage and determine the connection state of the connection interface 210, 220, and/or 310. The first reference voltage for determining the connection state of the connection interface 210, 220, and/or 310 may be, for example, a voltage level, a reference voltage, or a voltage threshold value for determination of an open state.

For example, the first reference for determining whether the connection interface 210, 220, and/or 310 is in the open state may be configured with reference to, for example, a voltage value (Vswing) for the general data transmission or reception operation according to the specification of the connection interface 210, 220, and/or 310. The processor 120 or 320 may determine that the connection interface 210, 220, and/or 310 is in the open state if the voltage level of the received signal is higher than the first reference voltage.

For example, while monitoring a signal received after outputting an inspection signal based on a designated bit rate, during a designated time, the processor 120 or 320 may determine that a corresponding signal line of the connection interface 210, 220, and/or 310 is in the open state if, for example, a signal having a voltage level higher than the first reference voltage for the determination of the open state is received even once.

According to certain embodiments, the processor 120 or 320 may compare the voltage level of a reception signal of the processor 120 or 320 with a second reference voltage and may determine the connection state of the connection interface 210, 220, and/or 310. The second reference voltage for determining a connection state of the connection interface 210, 220, and/or 310 may be, for example, a voltage level, a reference voltage, or a voltage threshold value for determination of a short state.

For example, the second reference voltage for determination of the short state of the connection interface 210, 220, and/or 310 may be configured with reference to, for example, a voltage value (Vswing) for the general data transmission or reception operation according to the specification of the connection interface 210, 220, and/or 310.

The processor 120 or 320 may determine that the connection interface 210, 220, and/or 310 is in the short state if the voltage level of the received signal is lower than the second reference voltage.

For example, while monitoring a signal received after outputting an inspection signal based on a designated bit rate, during a designated time, the processor 120 or 320 may determine that a corresponding signal line of the connection interface 210, 220, and/or 310 is in the short state if, for example, a signal having a voltage level lower than the second reference voltage for the determination of the short state is received even once.

According to certain embodiments, in operation 811, the processor 120 or 320 may store a connection state of the connection interface 210, 220, and/or 310.

According to certain embodiments, for example, wherever the electronic device 101 is in the power-on (active) state, or depending on a preconfigured period or situation, such as the case in which the electronic device 101 is changed from a standby state to an active state, the processor 120 or 320 may inspect the connection state of the connection interface 210, 220, and/or 310 and update the result of the inspection.

According to certain embodiments, the processor 120 or 320 may transmit, for example, the result of the inspection to an external device (e.g., the external electronic device 102, 104, or 108 of FIG. 1). According to certain embodiments, the processor 120 or 320 may output an alarm if a designated event occurs such as the case in which as the result of the inspection, the connection state of the connection interface 210, 220, and/or 310 is found not to be normal, and provide the inspection result to a user.

Figure 9:
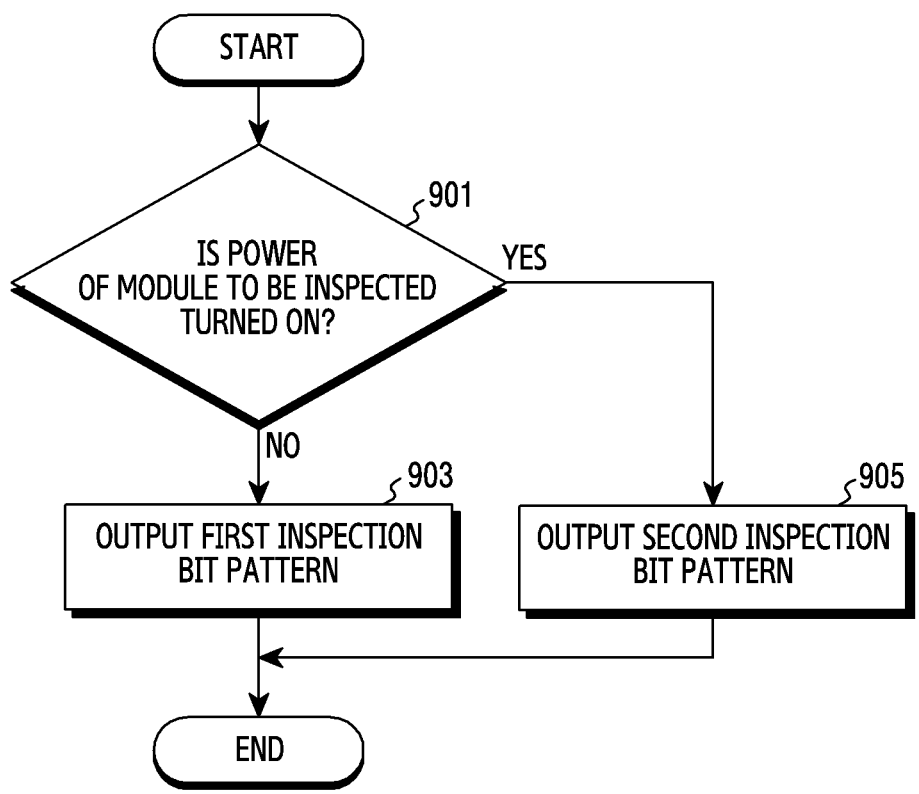
FIG. 9 illustrates another example of an operation of inspecting a connection interface of an electronic device according to certain embodiments.

FIG. 9 illustrates another example of the operation of an electronic device according to certain embodiments. The operations illustrated in FIG. 9 more specifically describe, for example, operation 805 in FIG. 8 of outputting an inspection bit pattern depending on the power state of the off-board electronic component to be inspected 330. The operation may be performed by the electronic device 101 or at least one component (e.g., the processor 120 of FIG. 1, the processor 320 of FIG. 3, and/or the connection interface 210, 220, and/or 310) included in the electronic device 101, illustrated in FIG. 1, FIG. 2, and FIG. 3.

In operation 901, the processor may identify a power-on/off state of the off-board electronic component to be inspected 330.

In operation 903, if the off-board electronic component to be inspected 330 is in the power-off state, the processor 120 or 320 may output a first inspection bit pattern to the high-speed transmission buffer 321 and transmit an inspection signal waveform according to the inspection bit pattern from the high-speed transmission buffer 321 to the off-board electronic component to be inspected 330 through the connection interface 310.

According to certain embodiments, the first inspection bit pattern may be, for example, a bit pattern of "101010 . . . ", which is configured in advance based on a preconfigured bit rate. Accordingly, the processor 120 or 320 may enable, for example, a 0.5 V signal waveform to be output from the high-speed transmission buffer 321 at a first start time point 0 with reference to a time corresponding to a time twice as long as the time taken (TC) for a signal waveform output from the processor 120 or 320 to reach the off-board electronic component to be inspected 330 and for a reflected wave to return again to the processor 120 or 320, i.e., a time corresponding to one period of the configured bit rate, and may enable the output waveform of the high-speed transmission buffer 321 to be changed to 0 V at a time point after TC, which is half (½) of a bit rate period. The level of the first inspection bit pattern of the transmission signal may be configured to be periodically changed according to the configured bit rate.

The first inspection bit pattern may be, for example, a bit pattern of "101010 . . . ", which is configured in advance based on a preconfigured bit rate. Accordingly, the processor 120 or 320 may enable, for example, a 0 V signal waveform to be output from the high-speed transmission buffer 321 at a first start time point 0 with reference to a time corresponding to a time twice as long as the time taken (TC) for a signal waveform output from the processor 120 or 320 to reach the off-board electronic component to be inspected 330 and for a reflected wave to return again to the processor 120 or 320, i.e., a time corresponding to one period of the configured bit rate, and may enable the output waveform of the high-speed transmission buffer 321 to be changed to 0.5 V at a time point after TC, which is half (½) of a bit rate period. The level of the first inspection bit pattern of the transmission signal may be configured to be periodically changed according to the configured bit rate.

In operation 905, if the off-board electronic component to be inspected 330 is in the power-on state, the processor 120 or 320 may output a second inspection bit pattern to the high-speed transmission buffer 321 and transmit an inspection signal waveform according to the second inspection bit pattern from the high-speed transmission buffer 321 to the off-board electronic component to be inspected 330 through the connection interface 310.

According to certain embodiments, the second inspection bit pattern may be, for example, a bit pattern of "111111 . . . ", which is configured in advance based on a preconfigured bit rate.

For example, the processor 120 or 320 may output, for example, a 0.5 V signal waveform without continuously changing the size of the signal waveform during an inspection period after time 0 based on the configured bit rate, from the high-speed transmission buffer 321 according to the second inspection bit pattern.

According to certain embodiments, the second inspection bit pattern may be, for example, a bit pattern of "111111 . . . ", which is configured in advance based on a preconfigured bit rate. Accordingly, the processor 120 or 320 may configure, for example, a 0 V signal waveform to be output from the high-speed transmission buffer 321 at a first start time point 0 with reference to a time corresponding to a time twice as long as the time taken (TC) for a signal waveform output from the processor 120 or 320 to reach the off-board electronic component to be inspected 330 and for a reflected wave to return again to the processor 120 or 320, i.e., a time corresponding to one period of the configured bit rate, may configure the output waveform of the high-speed transmission buffer 321 to be changed to 0.5 V at a time point after TC which is half (½) of a bit rate period, and then may configure a 0.5 V signal waveform to be continuously output during an inspection period.

Figure 10:
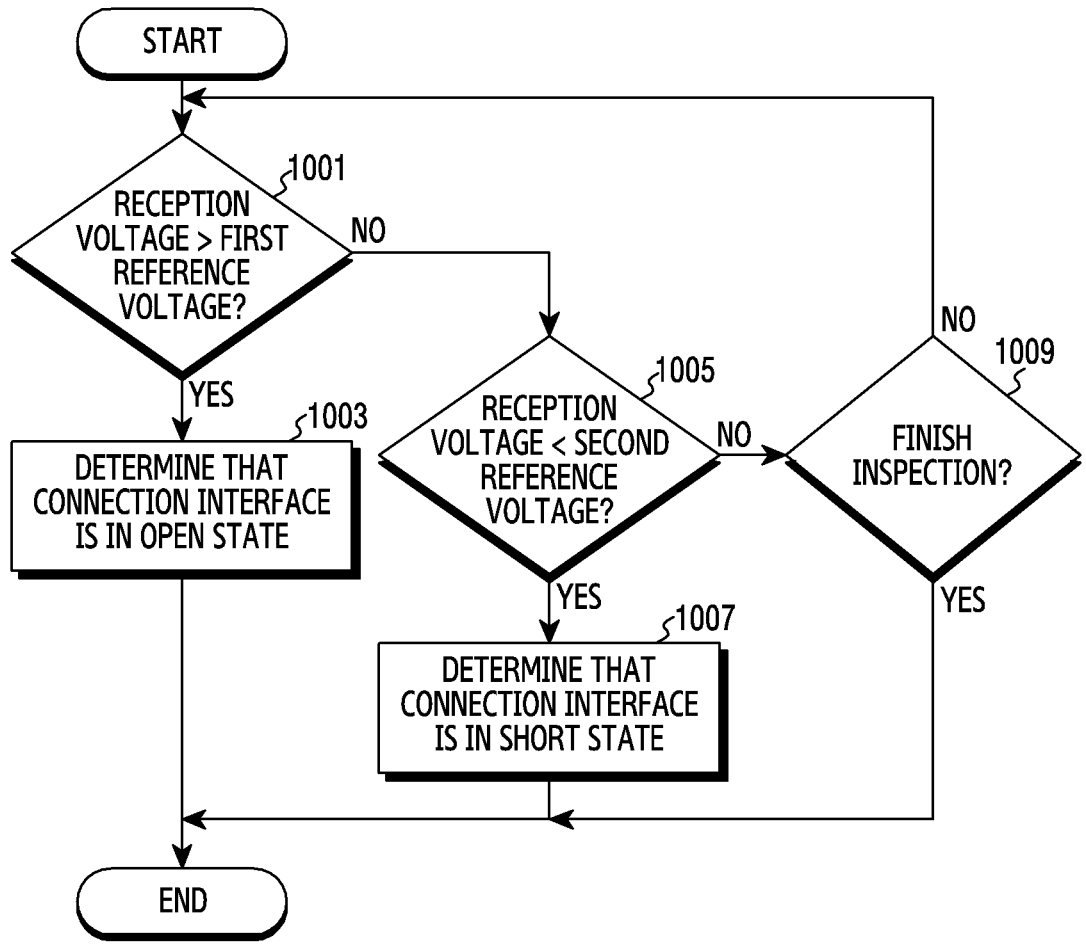
FIG. 10 illustrates an example of an operation of inspecting a connection interface of an electronic device according to certain embodiments.

FIG. 10 illustrates an example of an operation of inspecting a connection interface 210, 220, and/or 310 of an electronic device 101 according to certain embodiments. The operations illustrated in FIG. 10 more specifically describe, for example, operation 809 in FIG. 8 of determining the state of a connection interface 210, 220, and/or 310 of an electronic device 101. The operation may be performed by the electronic device 101 or at least one component (e.g., the processor 120 of FIG. 1, the processor 320 of FIG. 3, and/or the connection interface 210, 220, and/or 310) included in the electronic device 101, illustrated in FIG. 1, FIG. 2, and FIG. 3.

According to certain embodiments, in operation 1001, the processor 120 or 320 may monitor a reception signal received by the processor 120 or 320 and compare the voltage level of the reception signal of the processor 120 or 320 with a first reference voltage. The reception signal of the processor 120 or 320 may be, for example, an input signal of a low-power reception buffer (e.g., the low-power reception buffer 324 of FIG. 3) of the processor 120 or 320. The first reference voltage for determining the connection state of the connection interface 210, 220, and/or 310 may be, for example, a voltage level, a reference voltage, or a voltage threshold value for determination of an open state.

For example, the processor 120 or 320 may identify the voltage level of a signal received by the low-power reception buffer 324 of the processor 120 or 320 in order to inspect a connection state of the connection interface 210, 220, and/or 310. For example, the processor 120 or 320 may continuously monitor the received signal during a designated time, identify the voltage level of the received signal, and compare the same with a first reference voltage level. For example, the processor 120 or 320 may monitor the signal received at a designated time point during a designated time, identify the level of the received voltage, and compare the same with the first reference voltage level.

The first reference voltage for determining the connection state of the connection interface 210, 220, and/or 310, for example, the first reference voltage for determining an open state of the connection interface 210, 220, and/or 310, may be configured based on, for example, a voltage value (Vswing) for the general transmission or reception operation according to the specification of the connection interface 210, 220, and/or 310. The reference voltage may be configured to be, for example, a value greater than a voltage value (Vswing) for the general transmission or reception operation according to the specification of the connection interface 210, 220, and/or 310. For example, the reference voltage for determining the open state of the connection interface 210, 220, and/or 310 may be configured to be, for example, a value greater than Vswing and smaller than 2*Vswing.

If the voltage level of the received signal is higher than the first reference voltage in operation 1001, the processor 120 or 320 may determine that the connection interface 210, 220, and/or 310 is in the open state in operation 1003.

For example, while monitoring a signal received after outputting an inspection signal based on a designated bit rate, during a designated time, the processor 120 or 320 may determine that a corresponding signal line of the connection interface 210, 220, and/or 310 is in the open state when, for example, a signal having a voltage level higher than the first reference voltage for the determination of the open state is received even once.

According to certain embodiments, when it is determined, in operation 1001, that the voltage level of the reception signal received by the processor 120 or 320 is not higher than the first reference voltage, the voltage level of the reception signal may be compared to a second reference voltage for determination of the short state in operation 1005. When the voltage level of the reception signal is lower than the reference voltage, it may be determined that the connection interface 210, 220, and/or 310 is in the short state in operation 1007.

For example, the processor 120 or 320 may determine that a corresponding signal line of the connection interface 210, 220, and/or 310 is in the short state when a value lower than the second reference voltage is detected as the level of the reception signal even once.

According to certain embodiments, in operation 1009, the processor 120 or 320 may determine whether the voltage level of the reception signal received by the processor 120 or 320 has been monitored for a pre-designated time, and when the pre-designated time passes, may determine that the connection state is normal and may finish the inspection.

Figure 11:
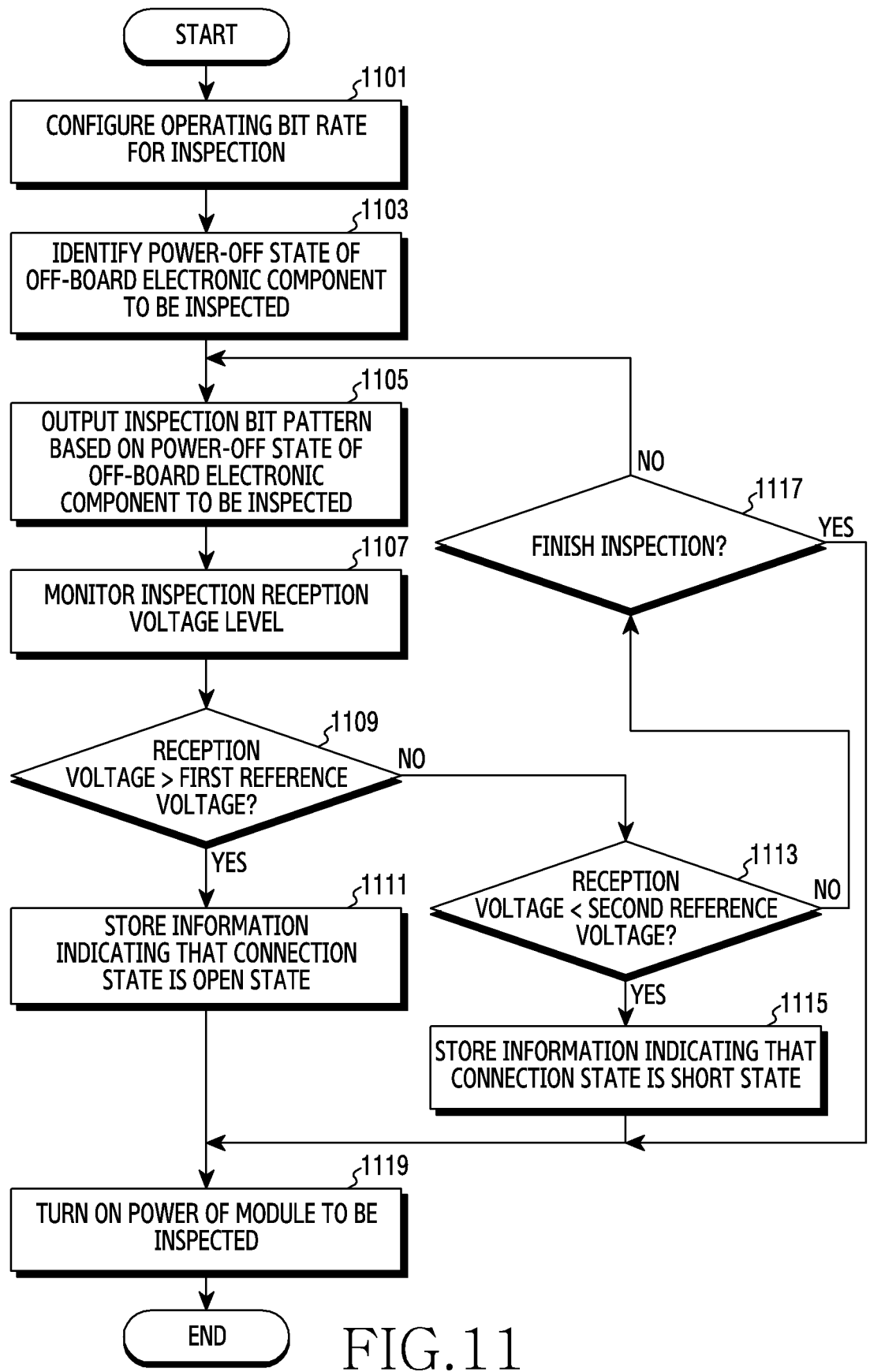
FIG. 11 illustrates another example of an operation of an electronic device according to certain embodiments.

FIG. 11 illustrates another example of an operation of an electronic device according to certain embodiments. The operation may be performed by the electronic device 101 or at least one component (e.g., the processor 120 of FIG. 1, the processor 320 of FIG. 3, and/or the connection interface 210, 220, and/or 310) included in the electronic device 101, illustrated in FIG. 1, FIG. 2, and FIG. 3.

Referring to FIG. 11, the processor 120 or 320 may configure, in operation 1101, an operating bit rate of an inspection signal to be transmitted to an off-board electronic component to be inspected 330 (e.g., the display device 160 or the camera module 180 of FIGS. 1 to 2) of the electronic device 101.

For example, the operating bit rate of the inspection signal output from the processor 120 or 320 may be configured differently from the operating bit rate of a data signal transmitted or received by the processor 120 or 320 under the general operation control of the off-board electronic component to be inspected 330. For example, the operating bit rate of the inspection signal may be configured to be the reciprocal of a value equal to twice the amount of time taken for a signal transmitted from the processor 120 or 320 to be transmitted to a final end of the off-board electronic component to be inspected 330 through the connection interface 210, 220, and/or 310. In this case, the voltage level of the inspection signal output from the processor 120 or 320 may be configured the same as the voltage level of the general operation signal according to a standard specification adopted by the connection interface 210, 220, and/or 310.

In operation 1103, the processor may identify that the off-board electronic component to be inspected 330 is in a power-off state.

In operation 1105, the processor 120 or 320 may output an inspection bit pattern to the high-speed transmission buffer 321 based on the power-off state of the off-board electronic component to be inspected 330 and transmit an inspection signal according to the inspection bit pattern from the high-speed transmission buffer 321 to the off-board electronic component to be inspected 330 through the connection interface 310.

For example, in response to the power-off (inactive) state of the display device 160 or the camera module 180, which is the off-board electronic component to be inspected, the processor 120 or 320 may output a bit pattern based on the configured bit rate, for example, "101010 . . . " or "010101 . . . ". This case may correspond to, for example, the case where no power is supplied to the high-speed reception buffer (e.g., the high-speed reception buffer 331 of FIG. 3) of the display device 160 or the camera module 180.

For example, referring to FIGS. 6A and 6B again, in response to a power-off state (inactive) of the display device 160 or the camera module 180, which is the off-board electronic component to be inspected, the processor 120 or 320 may configure a waveform of an inspection signal output from the high-speed transmission buffer 321 of the processor 120 or 320 to be periodically changed based on the configured bit rate, for example, 0 V from time 0 to time 2 nsec, 0.5 V from time 2 nsec to time 4 nsec, and 0 V from time 4 nsec to time 6 nsec.

In operation 1107, the processor 120 or 320 may identify the voltage level of the received inspection signal. For example, the processor 120 or 320 may monitor an input signal of the low-power reception buffer 324 and identify the voltage level of the input signal. For example, while continuously monitoring a received signal during a designated time, the processor 120 or 320 may identify the voltage level of the received signal. For example, while monitoring a received signal at a designated time point during a designated time, the processor 120 or 320 may identify the level of the reception voltage.

In operation 1109, the processor 120 or 320 may compare the identified level of the reception voltage with a first reference voltage and determine the connection state of the connection interface 210, 220, and/or 310. The first reference voltage for determining the connection state of the connection interface 210, 220, and/or 310 may be, for example, a voltage level, a reference voltage, or a voltage threshold value for determining an open state. For example, the first reference voltage may be configured to be, for example, a value greater than Vswing and smaller than 2*Vswing.

In operation 1111, when the voltage level of the received signal is higher than the first reference voltage, the processor 120 or 320 may store information indicating that the connection interface 210, 220, and/or 310 is in the open state.

For example, while monitoring a signal received after outputting an inspection signal based on a designated bit rate, during a designated time, the processor 120 or 320 may determine that a corresponding signal line of the connection interface 210, 220, and/or 310 is in the open state when, for example, a signal having a voltage level higher than the first reference voltage for the determination of the open state is received even once.

In operation 1113, the processor 120 or 320 may compare the voltage level of the reception signal of the processor 120 or 320 with a second reference voltage and determine the connection state of the connection interface 210, 220, and/or 310. The second reference voltage for determining the connection state of the connection interface 210, 220, and/or 310 may be, for example, a voltage level, a reference voltage, or a voltage threshold value for determining a short state.

In operation 1115, when the voltage level of the received signal is lower than the second reference voltage, the processor 120 or 320 may store information indicating that the connection interface 210, 220, and/or 310 is in a short state. When the off-board electronic component to be inspected is in the off state, the second reference voltage may be configured to be a value smaller than 0 V and greater than a voltage value (−Vswing) for the general data transmission or reception operation according to the specification of the connection interface 210, 220, and/or 310.

For example, while monitoring a signal received after outputting an inspection signal based on a designated bit rate, during a designated time, the processor 120 or 320 may determine that a corresponding signal line of the connection interface 210, 220, and/or 310 is in the short state when, for example, a signal having a voltage level lower than the second reference voltage for the determination of the short state is received even once.

According to certain embodiments, in operation 1117, the processor 120 or 320 may determine whether the voltage level of the reception signal received by the processor 120 or 320 has been monitored for a designated time and may finish the inspection when the designated time passes.

After the inspection is finished, the processor 120 or 320 may control, in operation 1119, the off-board electronic component to be inspected 330 to be in a power-on (active) state.

Figure 12:
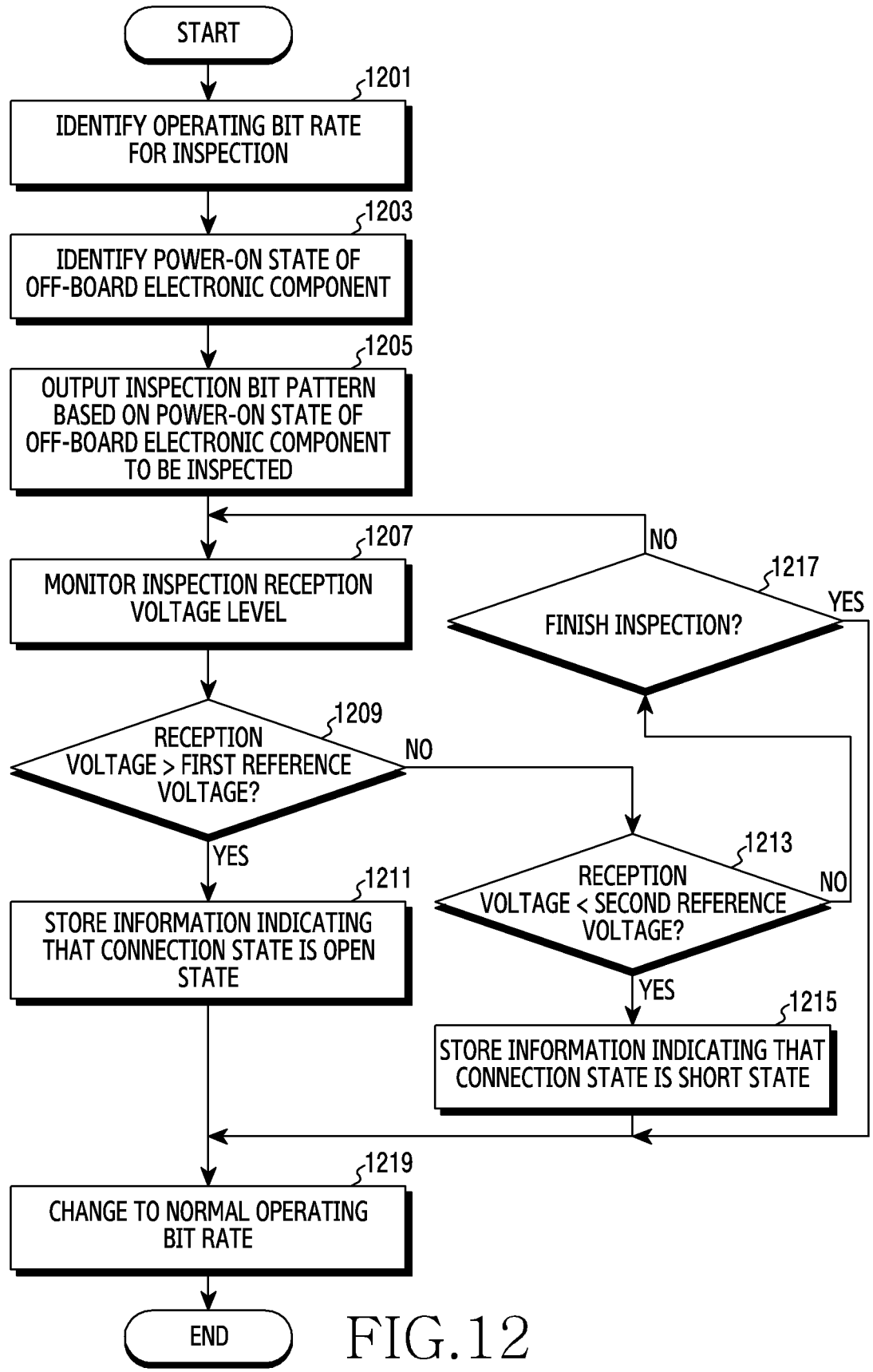
FIG. 12 illustrates another example of an operation of an electronic device according to certain embodiments.

FIG. 12 illustrates another example of the operation of an electronic device according to certain embodiments. The operation may be performed by the electronic device 101 or at least one component (e.g., the processor 120 of FIG. 1, the processor 320 of FIG. 3, and/or the connection interface 210, 220, and/or 310) included in the electronic device 101, illustrated in FIG. 1, FIG. 2, and FIG. 3.

Referring to FIG. 12, the processor 120 or 320 may configure, in operation 1201, the operating bit rate of an inspection signal to be transmitted to an off-board electronic component to be inspected 330 (e.g., the display device 160 or the camera module 180 of FIGS. 1 to 2) of the electronic device 101.

For example, the operating bit rate of the inspection signal output from the processor 120 or 320 may be configured differently from the operating bit rate of a data signal transmitted or received by the processor 120 or 320 according to a general operation control of the off-board electronic component to be inspected 330. For example, the operating bit rate of the inspection signal may be configured to be the reciprocal of a value equal to twice the amount of time taken for a signal transmitted from the processor 120 or 320 to be transmitted to a final end of the off-board electronic component to be inspected 330 through the connection interface 210, 220, and/or 310. In this case, the voltage level of the inspection signal output from the processor 120 or 320 may be configured the same as the voltage level of the general operation signal according to a standard specification adopted by the connection interface 210, 220, and/or 310.

In operation 1203, the processor may identify that the off-board electronic component to be inspected 330 is in a power-on (active) state.

In operation 1205, the processor 120 or 320 may output an inspection bit pattern to the high-speed transmission buffer 321 based on the power-on state of the off-board electronic component to be inspected 330 and transmit an inspection signal according to the inspection bit pattern from the high-speed transmission buffer 321 to the off-board electronic component to be inspected 330 through the connection interface 310. This case may correspond to, for example, the case where power is supplied to the high-speed reception buffer (e.g., the high-speed reception buffer 331 of FIG. 3) of the off-board electronic component to be inspected 330 (e.g., the display device 160 or the camera module 180).

For example, in response to the power-on (active) state of the off-board electronic component to be inspected 330 (e.g., the display device 160 or the camera module 180), the processor 120 or 320 may output, for example, a bit pattern of "11111 . . . " based on the configured bit rate.

In another example, in response to the power-on (active) state of the display device 160 or the camera module 180, which is the off-board electronic component to be inspected, the processor 120 or 320 may output, for example, a bit pattern of "01111 . . . " based on the configured bit rate.

For example, the bit pattern may be continuously output from the high-speed transmission buffer 321 based on the configured bit rate during an inspection period while a 0.5 V signal waveform is not changed at Time 0 and even after Time 2TC.

For example, referring to FIGS. 7A and 7B again, in response to a power-on (inactive) state of the display device 160 or the camera module 180, which is the off-board electronic component to be inspected, as the waveform of an inspection signal output from the high-speed transmission buffer 321 of the processor 120 or 320, a 0.5 V signal waveform may be continuously output based on the configured bit rate after a 0 V signal waveform is output at time 0 and a 0.5 V signal waveform is output at time 2TC based on the configured bit rate.

In operation 1207, the processor 120 or 320 may identify the voltage level of the received inspection signal. For example, the processor 120 or 320 may monitor an input signal of the low-power reception buffer 324 and identify the voltage level of the input signal. For example, while continuously monitoring a received signal during a designated time, the processor 120 or 320 may identify the voltage level of the received signal. For example, while monitoring a received signal at a designated time point during a designated time, the processor 120 or 320 may identify the level of the reception voltage.

In operation 1209, the processor 120 or 320 may compare the identified level of the reception voltage with a first reference voltage and determine the connection state of the connection interface 210, 220, and/or 310. The first reference voltage for determining the connection state of the connection interface 210, 220, and/or 310 may be, for example, a voltage level, a reference voltage, or a voltage threshold value for determining an open state. For example, the first reference voltage may be configured to be, for example, a value greater than Vswing and smaller than 2*Vswing.

In operation 1211, when the voltage level of the received signal is higher than the first reference voltage, the processor 120 or 320 may store information indicating that the connection interface 210, 220, and/or 310 is in the open state.

For example, while monitoring a signal received after outputting an inspection signal based on a designated bit rate, during a designated time, the processor 120 or 320 may determine that a corresponding signal line of the connection interface 210, 220, and/or 310 is in the open state when, for example, a signal having a voltage level higher than the first reference voltage for the determination of the open state is received even once.

In operation 1213, the processor 120 or 320 may compare the voltage level of the reception signal of the processor 120 or 320 with a second reference voltage and determine the connection state of the connection interface 210, 220, and/or 310. The second reference voltage for determining the connection state of the connection interface 210, 220, and/or 310 may be, for example, a voltage level, a reference voltage, or a voltage threshold value for determining a short state. For example, when the state of the off-board electronic component to be inspected is the off state, the second reference voltage may be configured to be a value smaller than or equal to 0 V and greater than a product (−Vswing) of −1 and a voltage value (Vswing) for the general data transmission or reception operation according to the specification of the connection interface 210, 220, and/or 310.

In operation 1215, when the voltage level of the received signal is lower than the second reference voltage, the processor 120 or 320 may store information indicating that the connection interface 210, 220, and/or 310 is in the short state.

For example, while monitoring a signal received after outputting an inspection signal based on a designated bit rate, during a designated time, the processor 120 or 320 may determine that a corresponding signal line of the connection interface 210, 220, and/or 310 is in the short state if, for example, a signal having a voltage level lower than the second reference voltage for the determination of the short state is received even once.

According to certain embodiments, in operation 1217, the processor 120 or 320 may determine whether the voltage level of the reception signal received by the processor 120 or 320 has been monitored for a designated time and may finish the inspection if the designated time has passed.

After the inspection is finished, in operation 1219, the processor 120 or 320 may change the operating bit rate of the off-board electronic component to be inspected 330 to a normal operating bit rate for general operation and may transmit or receive a control signal and a data signal for the off-board electronic component to be inspected 330 through the connection interface 210, 220, and/or 310.

According to certain embodiments, a method of an electronic device including a main board (e.g., the main board 230 of FIG. 2) having a processor (e.g., the processor 120 of FIG. 1 or FIG. 2 or the processor 320 of FIG. 3) mounted thereon and a off-board electronic component to be inspected (e.g., the display device 160 or the camera module 180 of FIG. 2 and/or FIG. 3), which is connected thereto through a connection interface (e.g., the connection interface 210 or 220 of FIG. 2 or the connection interface 310 of FIG. 3) may include: outputting an inspection signal having a particular bit pattern based on a designated frequency to the connection interface, by the processor; identifying a voltage level of a reception signal input to the processor, during a designated time, in response to the output of the inspection signal particular bit pattern; and determining a connection state of the connection interface based on the identified voltage level of the reception signal.

According to certain embodiments, the designated bit rate may be configured based on the reciprocal of a value equal to twice the amount of time taken for the inspection signal transmitted from the processor to reach the off-board electronic component to be inspected.

According to certain embodiments, the determining of the connection state may include determining at least one of an open state and a short state of the connection interface.

According to certain embodiments, the determining of the connection state may include determining the connection state of the connection interface to be the open state if the voltage level of the reception signal is higher than a first reference voltage for at least one time point.

According to certain embodiments, the first reference voltage level may equal to or higher than the voltage level of the inspection signal.

According to certain embodiments, the determining of the connection state may include determining the connection state of the connection interface to be the short state if the identified voltage level of the reception signal is lower than a second reference voltage level for at least one time point.

According to certain embodiments, the second reference voltage level is lower than or equal to the voltage level of the inspection signal.

According to certain embodiments, the method may further include determining an on or off state of the off-board electronic component to be inspected, wherein as a result of the determination, if the off-board electronic component to be inspected is in the off state, the particular bit pattern may be configured to be a first bit pattern, and the level of at least a part of the first bit pattern may be changed based on the designated bit rate.

According to certain embodiments, as a result of the determination, if the off-board electronic component to be inspected is in the on state, the particular bit pattern may be configured to be a second bit pattern, and the level of at least a part of the second bit pattern may remain the same.

According to certain embodiments, the processor may include a high-speed transmission buffer and a low-power reception buffer, the inspection signal may be output from the high-speed transmission buffer to the connection interface, and the reception signal, which is input in response to the output of the inspection signal according to the particular bit pattern, may be input to the low-power reception buffer.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
   a printed circuit board (PCB);
   a processor mounted on the PCB; and
   a connection interface configured to connect the PCB to an off-board electronic component,
   wherein the processor is configured to:
      output an inspection signal to the connection interface according to a particular bit pattern at a designated bit rate;
      identify a voltage level of a reception signal input to the processor, during a designated time, in response to the output of the inspection signal comprising particular bit pattern; and
      determine a connection state of the connection interface based on the identified voltage level of the reception signal,
   wherein the processor is configured to:
      determine the connection state of the connection interface as an open state when the identified voltage level of the reception signal is higher than a first reference voltage level for at least one time point, the first reference voltage level being equal or higher than a voltage level of the inspection signal; and
      determine the connection state of the connection interface as a short state when the identified voltage level of the reception signal is lower than a second reference voltage level for at least one time point, the second reference voltage level being lower than or equal to the voltage level of the inspection signal.

2. The electronic device of claim 1, wherein the bit rate is based on a reciprocal of a value equal to twice an amount of time needed for the inspection signal transmitted to be received by the off-board electronic component.

3. The electronic device of claim 1, wherein the processor is configured to:
   determine an on or off state of the off-board electronic component; and
   set the particular bit pattern to be a first bit pattern if the off-board electronic component is in the off state as a result of the determination,
   wherein a level of at least a part of the first bit pattern is changed based on the designated bit rate.

4. The electronic device of claim 3, wherein the processor, as the result of the determination, is configured to sets the particular bit pattern to be a second bit pattern when the off-board electronic component is in the on state,
   wherein a level of at least a part of the second bit pattern remains the same.

5. The electronic device of claim 1, wherein the processor comprises:
   a high-speed transmission buffer configured to output the inspection signal to the connection interface; and
   a low-power reception buffer configured to receive the reception signal input in response to the output of the inspection signal according to the particular bit pattern.

6. A method of an electronic device, the electronic device comprising a printed circuit board (PCB), a processor mounted on the PCB and a connection interface configured to connect the PCB to an off-board electronic component, the method comprising:
   outputting an inspection signal having a particular bit pattern based on a designated bit rate to the connection interface, by the processor;

identifying a voltage level of a reception signal input to the processor, during a designated time, in response to the output of the inspection signal; and determining a connection state of the connection interface based on the identified voltage level of the reception signal, and wherein the determining of the connection state of the connection interface comprises:

determining the connection state of the connection interface as an open state when the identified voltage level of the reception signal is higher than a first reference voltage level for at least one time point, the first reference voltage level being equal to or higher than a voltage level of the inspection signal; and determining the connection state of the connection interface as a short state when the identified voltage level of the reception signal is lower than a second reference voltage level for at least one time point, the second reference voltage level being lower than or equal to the voltage level of the inspection signal.

7. The method of claim 6, wherein the designated bit rate is configured based on a reciprocal of a value equal to twice an amount of time taken for the inspection signal transmitted from the processor to reach the off-board electronic component.

8. The method of claim 6, further comprising:

determining an on or off state of the off-board electronic component, wherein, as a result of the determination, if the off-board electronic component is in the off state, the particular bit pattern is configured to be a first bit pattern, and wherein a level of at least a part of the first bit pattern is changed based on the designated bit rate.

9. The method of claim 8, wherein, as the result of the determination, if the off-board electronic component is in the on state, the particular bit pattern is configured to be a second bit pattern, and wherein a level of at least a part of the second bit pattern remains the same.

10. The method of claim 6, wherein the processor comprises a high-speed transmission buffer and a low-power reception buffer, wherein the inspection signal is output from the high-speed transmission buffer to the connection interface, and wherein the reception signal which is input in response to the output of the inspection signal according to the particular bit pattern is received by the low-power reception buffer.

\* \* \* \* \*